United States Patent
Jung et al.

(10) Patent No.: US 9,275,717 B2
(45) Date of Patent: Mar. 1, 2016

(54) REFRESH ADDRESS GENERATOR, VOLATILE MEMORY DEVICE INCLUDING THE SAME AND METHOD OF REFRESHING THE VOLATILE MEMORY DEVICE

(71) Applicant: Samsung Electronics Co., Ltd., Suwon-si (KR)

(72) Inventors: Bu-Il Jung, Hwaseong-si (KR); So-Young Kim, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/831,162

(22) Filed: Mar. 14, 2013

(65) Prior Publication Data

US 2014/0029367 A1 Jan. 30, 2014

(30) Foreign Application Priority Data

Jul. 30, 2012 (KR) ........................ 10-2012-0082889

(51) Int. Cl.
*G11C 11/403* (2006.01)
*G11C 11/406* (2006.01)
*G11C 11/4063* (2006.01)
*G11C 29/50* (2006.01)

(52) U.S. Cl.
CPC ...... *G11C 11/40615* (2013.01); *G11C 11/4063* (2013.01); *G11C 11/40611* (2013.01); *G11C 11/40618* (2013.01); *G11C 11/40626* (2013.01); *G11C 29/50016* (2013.01)

(58) Field of Classification Search
CPC ............ G06F 11/1451; G06F 11/2064; G06F 11/2082; G06F 12/00; G06F 12/12; G06F 12/08; G06F 12/122; G06F 12/02; G06F 12/10; G06F 12/0238; G06F 17/30215; G06F 17/30578; G06F 2201/84
See application file for complete search history.

(56) References Cited

U.S. PATENT DOCUMENTS

| 5,299,168 | A | * | 3/1994 | Kang ............................ 365/222 |
| 6,002,629 | A | * | 12/1999 | Kim et al. ...................... 365/222 |
| 6,622,197 | B1 | * | 9/2003 | Kim ............................... 711/100 |
| 2003/0061536 | A1 | * | 3/2003 | Nakai et al. ...................... 714/14 |
| 2004/0027900 | A1 | * | 2/2004 | Lee ................................ 365/222 |
| 2004/0090840 | A1 | * | 5/2004 | Lee et al. ....................... 365/200 |
| 2006/0004955 | A1 | * | 1/2006 | Ware et al. .................... 711/106 |
| 2006/0018174 | A1 | * | 1/2006 | Park et al. ..................... 365/222 |
| 2006/0087904 | A1 | * | 4/2006 | Pyo et al. ...................... 365/222 |
| 2006/0092741 | A1 | * | 5/2006 | Kim et al. ..................... 365/222 |
| 2006/0294311 | A1 | * | 12/2006 | Fu et al. ........................ 711/118 |
| 2007/0022245 | A1 | * | 1/2007 | Sohn et al. .................... 711/106 |
| 2007/0030746 | A1 | * | 2/2007 | Best et al. ..................... 365/222 |
| 2007/0033338 | A1 | * | 2/2007 | Tsern ............................ 711/106 |
| 2007/0033339 | A1 | * | 2/2007 | Best et al. ..................... 711/106 |

(Continued)

FOREIGN PATENT DOCUMENTS

KR 2012-0005856 A 1/2012

*Primary Examiner* — Jared Rutz
*Assistant Examiner* — Jean Edouard
(74) *Attorney, Agent, or Firm* — Muir Patent Law, PLLC

(57) ABSTRACT

A refresh address generator includes a refresh sequence buffer and a refresh address generating unit. The refresh sequence buffer stores a sequence of memory groups, each memory group including a plurality of memory cell rows. The refresh address generating unit generates a plurality of refresh row addresses according to the sequence of memory groups stored in the refresh sequence buffer, in response to a refresh signal.

23 Claims, 28 Drawing Sheets

(56) References Cited

U.S. PATENT DOCUMENTS

| | | |
|---|---|---|
| 2008/0016272 A1 | 1/2008 | Harrand |
| 2009/0168571 A1* | 7/2009 | Pyo et al. .................. 365/200 |
| 2009/0282189 A1 | 11/2009 | Best et al. |
| 2011/0007594 A1* | 1/2011 | Kim et al. .................. 365/222 |
| 2011/0131371 A1 | 6/2011 | Sun et al. |
| 2012/0008394 A1 | 1/2012 | Lee et al. |

* cited by examiner

| MG | MRRP |
|---|---|
| G0(RA0~RA99) | 2X |
| G1(RA100~RA199) | 0.5X |
| G2(RA200~RA299) | 1X |
| G3(RA300~RA399) | 2X |

| TIMING | SI | RP |
|---|---|---|
| T1~T100 | G0(RA0~RA99) | 2X |
| T101~T200 | G1(RA100~RA199) | 0.5X |
| T201~T300 | G2(RA200~RA299) | 1X |
| T301~T400 | G1(RA100~RA199) | 0.5X |
| T401~T500 | G3(RA300~RA399) | 2X |
| T501~T600 | G1(RA100~RA199) | 0.5X |
| T601~T700 | G2(RA200~RA299) | 1X |
| T701~T800 | G1(RA100~RA199) | 0.5X |
| T801~T900 | G0(RA0~RA99) | 2X |

410b

| TIMING | SA | EA | GS |
|--------|------|------|-----|
| T1~T100 | RA0 | RA99 | 100 |
| T101~T200 | RA100 | RA199 | 100 |
| T201~T300 | RA200 | RA299 | 100 |
| T301~T400 | RA100 | RA199 | 100 |
| T401~T500 | RA300 | RA399 | 100 |
| T501~T600 | RA100 | RA199 | 100 |
| T601~T700 | RA200 | RA299 | 100 |
| T701~T800 | RA100 | RA199 | 100 |
| T801~T900 | RA0 | RA99 | 100 |

460b

| MG | MRRP | EXCEPTION |
|---|---|---|
| G0(RA0~RA99) | 2X | RA20(1X),RA50(1X),RA60(0.5X) |
| G1(RA100~RA199) | 0.5X | |
| G1(RA200~RA299) | 1X | |
| G1(RA300~RA399) | 2X | |

410c

| TIMING | SI | ARA | RP |
|---|---|---|---|
| T1~T100 | G0(RA0~RA99) | | 2X |
| T101~T200 | G1(RA100~RA199) | RA60 | 0.5X |
| T201~T300 | G2(RA200~RA299) | RA20,RA50 | 1X |
| T301~T400 | G1(RA100~RA199) | RA60 | 0.5X |
| T401~T500 | G3(RA300~RA399) | | 2X |
| T501~T600 | G1(RA100~RA199) | RA60 | 0.5X |
| T601~T700 | G2(RA200~RA299) | RA20,RA50 | 1X |
| T701~T800 | G1(RA100~RA199) | RA60 | 0.5X |
| T801~T900 | G0(RA0~RA99) | | 2X |

GI ARA

| MG | MRRP | EXCEPTION |
|---|---|---|
| G0(RA0~RA49) | 2X | RA20(1X) |
| G1(RA50~RA99) | 4X | RA50(1X),RA60(2X) |
| G2(RA100~RA149) | 0.5X | |
| G3(RA150~RA199) | 1X | RA70(0.5X) |
| G4(RA200~RA249) | 4X | |
| G5(RA250~RA299) | 4X | |
| G6(RA300~RA349) | 4X | |
| G7(RA350~RA399) | 4X | |

| TIMING | SI | ARA | RP |
|---|---|---|---|
| T1~T50 | G2 | RA170 | 0.5X |
| T51~T100 | G3 | | 1X |
| T101~T150 | G1 | | 4X |
| T151~T200 | G4 | | 4X |
| T201~T250 | G2 | RA170 | 0.5X |
| T251~T300 | - | RA20, RA50 | 1X |
| T301~T350 | - | | - |
| T351~T400 | - | | - |
| T401~T450 | G2 | RA170 | 0.5X |
| T451~T500 | G3 | | 1X |
| T501~T550 | G7 | | 4X |
| T551~T600 | G0 | RA60 | 2X |
| T601~T650 | G2 | RA170 | 0.5X |
| T651~T700 | - | RA20, RA50 | 1X |
| T701~T750 | - | | - |
| T751~T800 | - | | - |

| TIMING | SI | ARA | RP |
|---|---|---|---|
| T801~T850 | G2 | RA170 | 0.5X |
| T851~T900 | G3 | | 1X |
| T901~T950 | G6 | | 4X |
| T951~T1000 | - | | - |
| T1001~T1050 | G2 | RA170 | 0.5X |
| T1051~T1100 | - | RA20, RA50 | 1X |
| T1101~T1150 | - | | - |
| T1151~T1200 | - | | - |
| T1201~T1250 | G2 | RA170 | 0.5X |
| T1251~T1300 | G3 | | 1X |
| T1301~T1350 | G7 | | 4X |
| T1351~T1400 | G0 | RA60 | 2X |
| T1401~T1450 | G2 | RA170 | 0.5X |
| T1451~T1500 | - | RA20, RA50 | 1X |
| T1501~T1550 | - | | - |
| T1551~T1600 | - | | - |

FIG. 17

|  | | | |
|---|---|---|---|
| RS[1,k] | | ... | RS[j,k] |
| ... | | ⋰ | ... |
| RS[1,2] | | ... | RS[j,2] |
| RS[1,1] | | ... | RS[j,1] |

TEMPORAL SLOT →

SPATIAL SLOT →

| GROUP INDEX | ADDRESS | MRRP |
|---|---|---|
| 0 | RA0~RA99 | 2X |
| 1 | RA100~RA199 | 0.25X |
| 2 | RA200~RA299 | 4X |
| 3 | RA300~RA399 | 0.5X |

FIG. 19

| TIMING | SLOT1 | SLOT1 |
|---|---|---|
| T1~T100 | 1 | 3 |
| T101~T200 | 1 | 0 |
| T201~T300 | 1 | 3 |
| T301~T400 | 1 | - |
| T401~T500 | 1 | 3 |
| T501~T600 | 1 | 2 |
| T601~T700 | 1 | 3 |
| T701~T800 | 1 | - |
| T801~T900 | 1 | 3 |
| T901~T1000 | 1 | 0 |
| T1001~T1100 | 1 | 2 |
| T1101~T1200 | 1 | - |
| T1201~T1300 | 1 | 3 |
| T1301~T1400 | 1 | - |
| T1401~T1500 | 1 | 3 |
| T1501~T1600 | 1 | - |

FIG. 20

| MRRP | ADDRESS |
|---|---|
| 0.5X | RA100~RA149 |
| 1X | RA150~RA199 EXCEPT RA170(0.5X) |
| 2X | RA0~RA49 EXCEPT RA20(1X) |
| 4X | RA50~RA99 EXCEPT RA50(1X),RA60(2X)<br>RA200~RA249<br>RA250~RA299<br>RA300~RA349<br>RA350~RA399 |

| GROUP INDEX | ADDRESS | MRRP | ARA |
|---|---|---|---|
| 0 | RA0~RA49 | 2X | RA60 |
| 1 | RA50~RA99 | 4X | |
| 2 | RA100~RA149 | 0.5X | |
| 3 | RA150~RA199 | 1X | RA170 |
| 4 | RA200~RA249 | 4X | |
| 5 | RA250~RA299 | 4X | |
| 6 | RA300~RA349 | 4X | |
| 7 | RA350~RA399 | 4X | |
| 8 | | | RA20, RA50 |

| TIMING | GROUP INDEX |
|---|---|
| T1~T50 | 2 |
| T51~T100 | 3 |
| T101~T150 | 1 |
| T151~T200 | 4 |
| T201~T250 | 2 |
| T251~T300 | 8 |
| T301~T350 | - |
| T351~T400 | - |
| T401~T450 | 2 |
| T451~T500 | 3 |
| T501~T550 | 7 |
| T551~T600 | 0 |
| T601~T650 | 2 |
| T651~T700 | 8 |
| T701~T750 | - |
| T751~T800 | - |

| TIMING | GROUP INDEX |
|---|---|
| T801~T850 | 2 |
| T851~T900 | 3 |
| T901~T950 | 6 |
| T951~T1000 | - |
| T1001~T1050 | 2 |
| T1051~T1100 | 8 |
| T1101~T1150 | - |
| T1151~T1200 | - |
| T1201~T1250 | 2 |
| T1251~T1300 | 3 |
| T1301~T1350 | 4 |
| T1351~T1400 | 0 |
| T1401~T1450 | 2 |
| T1451~T1500 | 8 |
| T1501~T1550 | - |
| T1551~T1600 | - |

| GROUP INDEX | ADDRESS | ARA | DRF |
|---|---|---|---|
| 0 | RA0~RA49 | RA60 | 0 |
| 1 | RA50~RA99 | | 1 |
| 2 | RA100~RA149 | RA170 | 1 |
| 3 | RA150~RA199 | | 0 |
| 4 | RA200~RA249 | | 1 |
| 5 | RA250~RA299 | | 1 |
| 6 | RA300~RA349 | | 1 |
| 7 | RA350~RA399 | | 0 |
| 8 | | RA20,RA50 | 1 |

| TIMING | GROUP INDEX | ARA |
|---|---|---|
| T1~T50 | 2 | RA170 |
| T51~T100 | SKIP(3) | |
| T101~T150 | 1 | |
| T151~T200 | 4 | |
| T201~T250 | 2 | RA170 |
| T251~T300 | 8 | RA20, RA50 |
| T301~T350 | – | |
| T351~T400 | – | |
| T401~T450 | 2 | RA170 |
| T451~T500 | SKIP(3) | |
| T501~T550 | SKIP(7) | |
| T551~T600 | SKIP(0) | |
| T601~T650 | 2 | RA170 |
| T651~T700 | 8 | RA20, RA50 |
| T701~T750 | – | |
| T751~T800 | – | |

| TIMING | GROUP INDEX | ARA |
|---|---|---|
| T801~T850 | 2 | RA170 |
| T851~T900 | SKIP(3) | |
| T901~T950 | 6 | |
| T951~T1000 | – | |
| T1001~T1050 | 2 | RA170 |
| T1051~T1100 | 8 | RA20, RA50 |
| T1101~T1150 | – | |
| T1151~T1200 | – | |
| T1201~T1250 | 2 | RA170 |
| T1251~T1300 | SKIP(3) | |
| T1301~T1350 | 5 | |
| T1351~T1400 | SKIP(0) | |
| T1401~T1450 | 2 | RA170 |
| T1451~T1500 | 8 | RA20, RA50 |
| T1501~T1550 | – | |
| T1551~T1600 | – | |

FIG. 25

| TIMING | GROUP INDEX | DRF |
|---|---|---|
| T1~T50 | 2 | 1 |
| T51~T100 | 3 | 1 |
| T101~T150 | 1 | 1 |
| T151~T200 | 4 | 1 |
| T201~T250 | 2 | 1 |
| T251~T300 | 8 | 1 |
| T301~T350 | - | 1 |
| T351~T400 | - | 1 |
| T401~T450 | 2 | 1 |
| T451~T500 | 3 | 1 |
| T501~T550 | 7 | 1 |
| T551~T600 | 0 | 1 |
| T601~T650 | 2 | 1 |
| T651~T700 | 8 | 1 |
| T701~T750 | - | 1 |
| T751~T800 | - | 1 |

| TIMING | GROUP INDEX | DRF |
|---|---|---|
| T801~T850 | 2 | 1 |
| T851~T900 | 3 | 1 |
| T901~T950 | 6 | 1 |
| T951~T1000 | - | 1 |
| T1001~T1050 | 2 | 1 |
| T1051~T1100 | 8 | 1 |
| T1101~T1150 | - | 1 |
| T1151~T1200 | - | 1 |
| T1201~T1250 | 2 | 1 |
| T1251~T1300 | 3 | 1 |
| T1301~T1350 | 5 | 1 |
| T1351~T1400 | 0 | 1 |
| T1401~T1450 | 2 | 1 |
| T1451~T1500 | 8 | 1 |
| T1501~T1550 | - | 1 |
| T1551~T1600 | - | 1 |

FIG. 26

| TIMING | GROUP INDEX | DRF |
|---|---|---|
| T1~T50 | 2 | 1 |
| T51~T100 | 3 | 1 |
| T101~T150 | 1 | 1 |
| T151~T200 | 4 | 1 |
| T201~T250 | 2 | 0 |
| T251~T300 | 8 | 1 |
| T301~T350 | - | 1 |
| T351~T400 | - | 1 |
| T401~T450 | 2 | 1 |
| T451~T500 | 3 | 1 |
| T501~T550 | 7 | 1 |
| T551~T600 | 0 | 1 |
| T601~T650 | 2 | 0 |
| T651~T700 | 8 | 1 |
| T701~T750 | - | 1 |
| T751~T800 | - | 1 |

| TIMING | GROUP INDEX | DRF |
|---|---|---|
| T801~T850 | 2 | 1 |
| T851~T900 | 3 | 1 |
| T901~T950 | 6 | 1 |
| T951~T1000 | - | 1 |
| T1001~T1050 | 2 | 0 |
| T1051~T1100 | 8 | 1 |
| T1101~T1150 | - | 1 |
| T1151~T1200 | - | 1 |
| T1201~T1250 | 2 | 1 |
| T1251~T1300 | 3 | 1 |
| T1301~T1350 | 5 | 1 |
| T1351~T1400 | 0 | 1 |
| T1401~T1450 | 2 | 0 |
| T1451~T1500 | 8 | 1 |
| T1501~T1550 | - | 1 |
| T1551~T1600 | - | 1 |

REFRESH ADDRESS GENERATOR, VOLATILE MEMORY DEVICE INCLUDING THE SAME AND METHOD OF REFRESHING THE VOLATILE MEMORY DEVICE

CROSS-REFERENCE TO RELATED APPLICATION(S)

This application claims priority under 35 USC §119 to Korean Patent Application No. 2012-0082889, filed on Jul. 30, 2012, in the Korean Intellectual Property Office (KIPO), the contents of which are incorporated herein in its entirety by reference.

BACKGROUND

1. Technical Field

Exemplary embodiments relate to memory devices, and more particularly to volatile memory devices, memory controllers, memory systems and a methods of refreshing volatile memory devices.

2. Discussion of the Related Art

A volatile memory device, such as a dynamic random access memory (DRAM), performs a refresh operation to retain data stored in memory cells. If a memory cell has a retention time shorter than a certain refresh period (often pre-defined as a standard), a row of memory cells including such a memory cell should be replaced with a row of redundancy cells. As the size of a memory cell shrinks, the number of memory cells having retention times shorter than a pre-defined or standard refresh period increases. Accordingly, the number of rows of redundancy cells of a conventional volatile memory device should be increased.

SUMMARY

Some example embodiments provide a refresh address generator. The refresh address generator may be capable of reducing refresh overhead.

Some example embodiments provide a volatile memory device including the refresh address generator capable of reducing refresh overhead.

Some example embodiments provide a memory system including the volatile memory device.

Some example embodiments provide a method of refreshing a volatile memory device. The method may be capable of reducing refresh overhead.

In some example embodiments, a refresh address generator includes a refresh sequence buffer and a refresh address generating unit. The refresh sequence buffer stores a sequence of memory groups, each memory group including a plurality of memory cell rows. The refresh address generating unit generates a plurality of refresh row addresses according to the sequence of memory groups stored in the refresh sequence buffer, in response to a refresh signal.

In some embodiments, the refresh sequence buffer includes a refresh sequence table having a plurality of rows, and each of the rows includes a refresh sequence node that stores refresh addresses included in each of the memory groups and refresh timing.

The refresh addresses of each of the memory groups are designated by a start address and an end address of the respective memory group or are designated by a representative refresh address representing each respective memory group.

In some embodiments, the refresh address generating unit may include a control unit that operates in response to the refresh signal where the control unit provides a clock signal and a representative refresh address representing each memory group based on the refresh row addresses and based on refresh timing; and a refresh address output unit that outputs refresh addresses of each of the memory groups according to the refresh timing as the refresh row address in response to the representative refresh address and the refresh timing.

At least one of the refresh sequence nodes may further include additional refresh address designating at least one memory cell row of at least one of other memory groups.

The memory cell row designated by the additional refresh address may have different data retention characteristic from the data retention characteristic of an original memory group.

The additional refresh address may be stored in the corresponding refresh sequence node by using a bloom filter.

The refresh address generating unit may include a control unit that operates in response to the refresh signal, where the control unit configured to provide a clock signal and a representative refresh address representing each memory group based on the refresh addresses and the refresh timing; a refresh address output unit that outputs refresh addresses of each of the rearranged memory groups according to the refresh timing as the refresh row address in response to the representative refresh address and the refresh timing; and a buffer that stores the additional refresh address and outputs the additional refresh address as an additional refresh row address according to control of the control unit.

The additional refresh address may be output while refresh addresses of a sequence node that stored the additional refresh address are output.

In some embodiments, the refresh sequence buffer may include a group table including a plurality of rows; and a refresh sequence table including a plurality of rows. Each row of the plurality of rows of the group table may include, for each memory group a group index, and refresh addresses included in the memory group, each group index indicating a its respective group. Each row of the plurality of rows of the sequence table may include, for each memory group, a group index and timing information of each group index.

At least one of the tables may further store additional refresh addresses designating at least one memory cell row of at least one other memory group.

The refresh address generator may further include a dynamic refresh flag indicating whether a refresh operation should be performed on a respective memory group or not.

The refresh address generating unit may perform a refresh address operation corresponding to an additional refresh address without regard to the dynamic refresh flag.

The refresh address generator may further include a dynamic refresh flag indicating whether refresh operation should be performed on each memory group or not, wherein the refresh address generating unit is configured to dynamically alter a refresh period of at least one of the memory groups based on the dynamic refresh flag.

In some embodiments, a memory device includes a volatile memory cell array including a plurality of memory cells, the memory cells being arranged in a plurality of memory cell rows, each memory cell row being addressable with a row address; a refresh sequence buffer configured to store a sequence of memory cell groups, each memory cell group comprising a set of at least two memory cell rows of the plurality of memory cell rows; a refresh address generating unit configured to generate a plurality of refresh row addresses according to the sequence of memory cell groups stored in the refresh sequence buffer; and a decoder, configured to decode the refresh row addresses generated by the refresh address generator to affect a refresh operation of memory cell rows corresponding to the refresh row addresses.

In some embodiments, a first group of the memory cell groups includes memory cells that have a first data retention characteristic, and a second group of the memory cell groups includes memory cells that have a second data retention characteristic different from the first data retention characteristic.

The refresh sequence buffer may be implemented with a static memory device.

The refresh sequence buffer may be implemented with a dynamic memory device, and contents to be stored in the refresh sequence buffer are loaded to the refresh sequence buffer from a nonvolatile memory device during a power-up sequence of the volatile memory device.

The refresh sequence buffer may be implemented with a nonvolatile memory device.

In some embodiments, the volatile memory device may further include temperature sensor that senses operating temperature of the volatile memory device and provides an operation mode signal to the refresh address generator based on the sensed operating temperature; and a refresh profile storing unit that includes a plurality of refresh profile tables, each refresh profile tables storing refresh profile indicating a refresh sequence of the memory cell groups according to the operating temperature, and the refresh profile storing unit provides the refresh sequence buffer with a refresh sequence of a refresh profile table corresponding to the operation mode signal.

In some example embodiments, a memory system includes a memory module including a plurality of volatile memory devices and a memory controller configured to control the volatile memory devices. Each of the volatile memory devices includes a memory cell array including a plurality of memory cell rows, a refresh address generator and an address multiplexer. The refresh address generator generates a plurality of refresh row addresses according to a sequence of memory cell groups, the memory cell groups each including a plurality of memory cell rows being grouped into the memory cell groups based on data retention characteristics of the plurality of memory cell rows. The memory system includes a decoder, configured to decode the refresh row addresses generated by the refresh address generator to affect a refresh operation of memory cell rows corresponding to the refresh row addresses.

In some embodiments, a method of refreshing a volatile memory device having a plurality of memory cell rows includes: assigning a first refresh rate to a first set of rows including at least a first and second row of the plurality of memory cell rows, and assigning a second refresh rate to a second set of rows including at least a third and fourth row of the plurality of memory cell rows, the first refresh rate different from the second refresh rate; and generating first refresh row addresses for the first set of rows and generating second refresh row addresses for the second set of rows according to a refresh sequence.

In some embodiments, the refresh sequence may be stored in a refresh sequence table of a refresh sequence buffer included in the volatile memory device.

In some embodiments, the method may further include updating the refresh sequence. updating the refresh sequence may include preparing a new refresh sequence in the refresh sequence table; and performing a refresh operation according to the new refresh sequence.

Accordingly, a plurality of memory cell rows are grouped into a plurality of memory groups based on data retention characteristics of the plurality of memory cell rows, the memory groups are rearranged according to the data retention characteristics, a refresh sequence is generated and refresh operation is performed according to the refresh sequence. Therefore, optimized refresh operation may be performed, current consumption may be reduced and refresh overhead may be reduced.

BRIEF DESCRIPTION OF THE DRAWINGS

Illustrative, non-limiting exemplary embodiments will be more clearly understood from the following detailed description taken in conjunction with the accompanying drawings.

FIG. 6 illustrates an example of the group table in FIG. 5 according to some embodiments.

FIG. 7 illustrates an example of the refresh sequence table in FIG. 5 according to some embodiments.

FIG. 15 illustrates another example of the group table in FIG. 5 according to some embodiments.

FIG. 16 illustrates another example of the refresh sequence table in FIG. 5 according to some embodiments.

FIG. 17 a table illustrating relations of memory cell rows which are simultaneously refreshed in response to one refresh signal.

FIG. 18 illustrates another example of the group table in FIG. 5 according to some embodiments.

FIG. 19 illustrates an example of the refresh slot table of FIG. 17 according to some embodiments.

FIG. 20 illustrates data retention characteristics of the memory cell array in FIG. 3.

FIG. 21 illustrates another example of the group table in FIG. 5 according to some embodiments.

FIG. 22 illustrates another example of the refresh sequence table in FIG. 5 according to some embodiments.

FIG. 23 illustrates another example of the group table in FIG. 5 according to some embodiments.

FIG. 24 illustrates another example of the refresh sequence table in FIG. 5 according to some embodiments.

FIGS. 25 and 26 illustrate examples of the refresh sequence table in FIG. 5 respectively according to some embodiments.

DETAILED DESCRIPTION OF THE EMBODIMENTS

Figure 1:
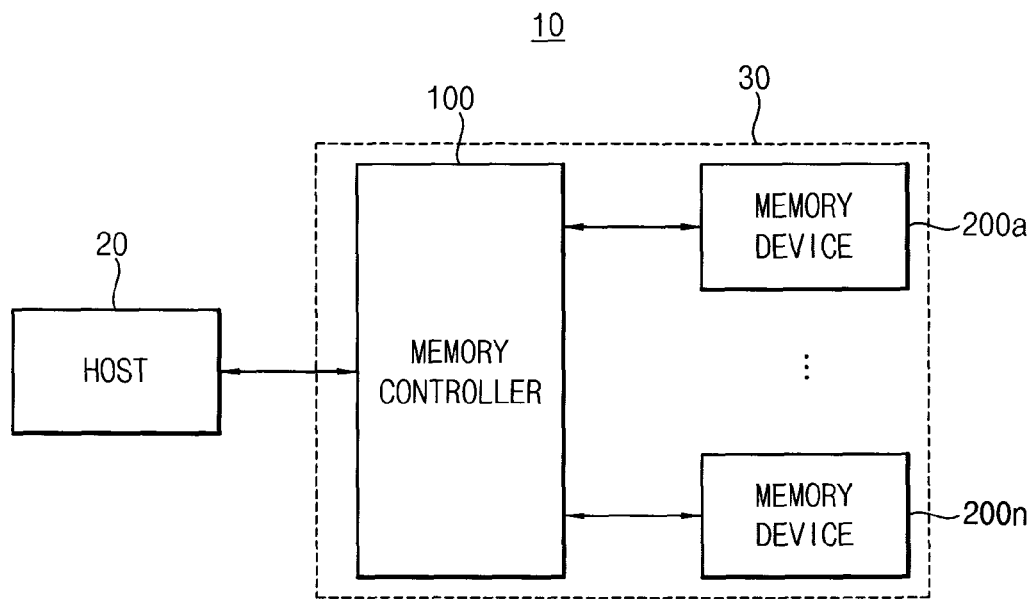
FIG. 1 is a block diagram illustrating an electronic system according to some example embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail— it is impracticable to list every possible variation for every feature described herein. The language of the claims should be referenced in determining the requirements of the invention. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to some example embodiments.

Referring to FIG. 1, an electronic system 10 includes a host 20 and a memory system 30. The memory system 30 includes a memory controller 100 and a plurality of memory devices 200a~200n.

The host 20 may communicate with the memory system 30 through interface protocol such as Peripheral Component Interconnect-Express (PCI-E), Advanced Technology Attachment (ATA), Serial ATA (SATA), Parallel ATA (PATA), or serial attached SCSI (SAS). In addition, the host 20 may communicate with the memory system 30 through interface protocol such as Universal Serial Bus (USB), Multi-Media Card (MMC), Enhanced Small Disk Interface (ESDI), or Integrated Drive Electronics (IDE).

The memory controller 100 controls operations of the memory system 30. The memory controller 100 controls data exchange between the host 20 and the memory devices 200a~200n. For example, the memory controller 100 writes data in the memory devices 200a~200n or reads data from the memory devices 200a~200n in response to requests from the host 20.

In addition, the memory controller 100 issues operational commands to the memory devices 200a~200n to control the memory devices 200a~200n.

In some embodiments, the each of the memory devices 200a~200n may be a dynamic random access memory (DRAM), such as a double data rate synchronous dynamic random access memory (DDR SDRAM), a low power double data rate synchronous dynamic random access memory (LP-DDR SDRAM), a graphics double data rate synchronous dynamic random access memory (GDDR SDRAM), a Rambus dynamic random access memory (RDRAM), etc., or may be other volatile memory devices that require a refresh operation.

Figure 2:
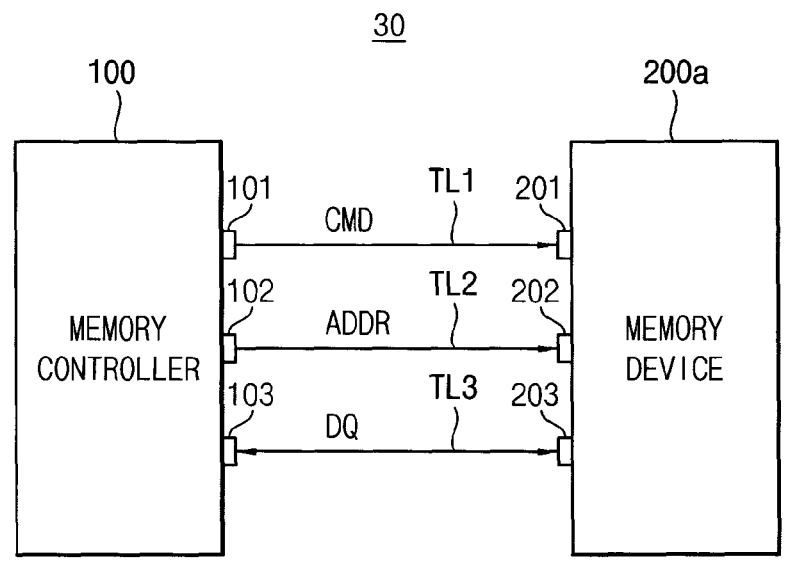
FIG. 2 is a block diagram illustrating an example of the memory system in FIG. 1 according to an embodiment.

FIG. 2 is a block diagram illustrating an example of the memory system in FIG. 1 according to an embodiment.

In FIG. 2 and much of the remaining description, only one memory device 200a connected to the memory controller 100 is illustrated for convenience. However, the details of the memory device 200a, its operation, control, etc. may be the same as those with respect to the other memory devices 200 of FIG. 1.

Referring to FIG. 2, the memory system 30 includes the memory controller 100 and the memory device 200a. The memory controller 100 and the memory devices 200a may be connected to each other through corresponding command pins 101 and 201, corresponding address pins 102 and 202 and corresponding data pins 103 and 203. The command pins 101 and 201 transmit a command signal CMD through a command transmission line TL1, the address pins 102 and 202 transmit a address signal ADDR through an address transmission line TL2, and the data pins 103 and 203 exchange data DQ through a data transmission line TL3.

Referring to FIGS. 1 and 2, the memory controller 100 may output data to the memory device 200a or may input data from the memory device 200a through the data pins 103 and 203 based on the request from the host 20. In addition, the memory controller 100 may output addresses to the memory device 200a through address pins 102 and 202. Commands may be sent by the memory controller 100 to the memory device 200a through command pins 101 and 201.

Figure 3:
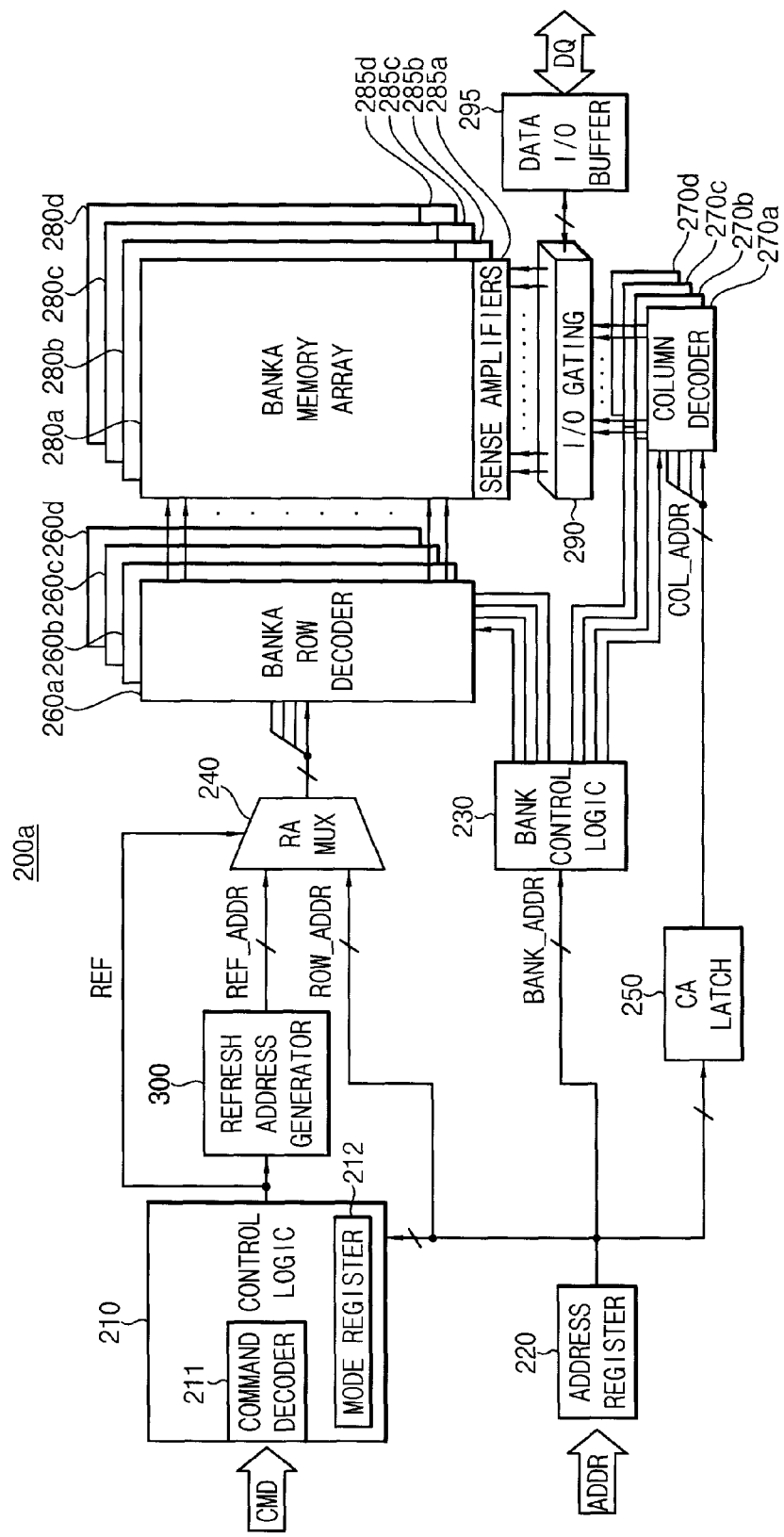
FIG. 3 is a block diagram illustrating an example of the memory device in FIG. 2 according to some example embodiments.

FIG. 3 is a block diagram illustrating an example of the memory device in FIG. 2 according to some example embodiments.

Referring to FIG. 3, the memory device 200a includes a control logic circuit 210, an address register 220, a bank control logic circuit 230, a row address multiplexer 240, a column address latch 250, a row decoder 260a~260d, a column decoder 270a~270d, a memory cell array 280a~280d, sense amplifiers 285a~285d, an input/output gating circuit 290, a data input/output buffer 295 and a refresh address generator 300.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d, the column decoder may include first through fourth bank column decoders 270a, 270b, 270c and 270d respectively coupled to the first through fourth bank arrays 280a, 280b, 280c and 280d, and the sense amplifier unit may include first through fourth bank sense amplifiers 285a, 285b, 385c and 385d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the volatile memory device 200 is illustrated in FIG. 3 as including four banks, the volatile memory device 200 may include any number of banks (e.g., eight banks, sixteen banks, etc.).

The address register 220 may receive an address ADDR including a bank address BANK_ADDR, a row address ROW_ADDR and a column address COL_ADDR from a memory controller (not shown). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh address generator 297. The row address multiplexer 240 may selectively output one of row address ROW_ADDR or the refresh row address REF_ADDR to the row decoder. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The input/output gating circuit 290 may include a circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295. Data DQ to be written to one bank array of the first through fourth bank arrays 280a, 280b, 280c and 280d may be provided from the memory controller to the data input/output buffer 295. The data DQ provided to the data input/output buffer 295 may be written to the one array bank via the write drivers of the input/output gating circuit 290.

The control logic circuit 210 may control operations of the memory device 200a. For example, the control logic circuit 210 may generate control signals for the memory device 200a to perform a write operation or a read operation. The control logic circuit 210 may include a command decoder 211 that decodes a command CMD received from the memory controller and a mode register 212 that sets an operation mode of the volatile memory device 200. For example, the command decoder 211 may generate the control signals corresponding to the command CMD. The command CMD may be sent to the memory device 200a from memory controller 100 in various manners. For example, the command CMD may be sent via transmission lines TL1 which provide a write enable signal (/WE), a row address strobe signal (/RAS), a column address strobe signal (/CAS), a chip select signal (/CS), etc, and the control signals generated by the command decoder 211 may be generated by decoding the same. The command decoder 211 may further receive a clock signal (CLK) and a clock enable signal (/CKE) for operating the volatile memory device 200 in a synchronous manner. In addition, the control logic circuit 210 may control the refresh address generator 300 to generate the refresh row address REF_ADDR.

The refresh address generator 300 includes a refresh sequence buffer that stores an arrangement of memory groups according to their respective data retention characteristics (e.g., data retention characteristics of memory cell rows forming the memory groups). The refresh address generator 300 generates refresh row addresses according to the arrangement of the memory groups. The arrangement of the memory groups may be stored in a refresh sequence buffer. The refresh row addresses may be generated in response to a refresh signal REF. The memory cell rows may be grouped into memory groups based on the data retention characteristics of the plurality of memory cell rows. Alternatively, the memory cell rows may be grouped based on their row addresses, and the memory cell groups may be arranged based on the data retention characteristics of the groups. Generation of refresh row addresses REF_ADDR by refresh address generator 300 may initiate refresh operation of the volatile memory device. For example, after a power-up sequence is completed, or after a power-down mode is terminated, the refresh operation may be initiated. In some embodiments, the refresh operation may be an auto refresh operation that generates a refresh row address in response to a periodically applied refresh command (REF) from memory controller 100. The refresh command REF may be periodically generated by the memory controller 100 at regular refresh intervals, such as every 3.9 microseconds or every 7.8 microseconds. The timing of the auto refresh operation of the memory device 200a may be responsive to the controller 100 by virtue of the timing of the generated refresh commands REF. In response to the refresh command REF, the memory device 200a may refresh one or more a memory cell rows corresponding to internally generated refresh row addresses. In the auto refresh operation, the refresh command REF sent from memory controller 100 may not include a refresh address—the memory device 200a may be responsible for determining the one or more memory cell rows to be refreshed and generating corresponding refresh addresses REF_ADDR. The memory device 200a may be responsible for assuring the memory cell rows are refreshed within a corresponding refresh time. In other embodiments, the refresh operation may be a self refresh operation that substantially periodically refreshes memory cell rows using a built-in timer in a self refresh mode into which the volatile memory device enters in response to a self refresh entry command (SRE). In some embodiments, the refresh operation may employ a distributed refresh scheme in which refresh cycles are distributed such that the refresh cycles are evenly spaced at predetermined periodic refresh intervals (tREFI). In other embodiments, the refresh operation may employ a burst refresh scheme in which a series of refresh cycles are consecutively performed.

Figure 4:
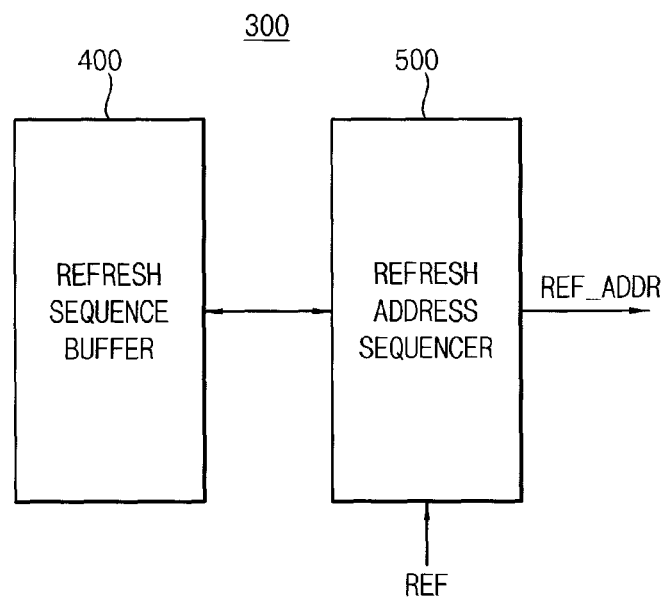
FIG. 4 is a block diagram illustrating an example of the refresh address generator according to some embodiments.

FIG. 4 is a block diagram illustrating an example of the refresh address generator according to some embodiments.

Referring to FIG. 4, the refresh address generator includes a refresh sequence buffer 400 and a refresh address sequencer (also referred to as a refresh address generating unit) 500.

In some embodiments, the refresh sequence buffer 400 stores arrangement information regarding an arrangement of memory groups according to data retention characteristics of each memory group (e.g., according to data retention characteristics of the memory cell rows included in the corresponding memory group). In some embodiments, the arrangement information of the refresh sequence buffer 400 may comprise a table storing the arrangement of the memory groups, in other embodiments, the arrangement information may comprise timing information indicating a desired refresh period for each of the memory groups. The refresh address sequencer 500 generates refresh row addresses according to an order of the arrangement of memory groups by referring to the refresh sequence buffer 400, in response to a refresh signal. The memory cell rows may be grouped into the memory groups based on the data retention characteristics of the plurality of memory cell rows. The refresh address sequencer 500 generates a refresh row address REF_ADDR according to an order of the arranged memory groups by referring to the refresh sequence buffer 400, in response to a refresh signal REF. The arrangement information of stored in the refresh sequence buffer 400 may be set according to data retention characteristics of a plurality of memory cell rows of each memory group, which may be determined during testing. For example, memory groups may include low retention memory groups that include at least one memory cell row having a relatively short or low retention time (low retention row). Memory groups may include normal retention memory groups whose memory cell rows all have normal (or higher) retention times. Memory groups may include high retention memory groups whose memory cell rows all have retention times longer or higher than normal (high retention rows). The refresh sequence buffer 400 may have more entries for low retention memory groups than those for both normal retention memory groups and those for high retention memory groups. High retention memory groups may have less entries in the refresh sequence buffer 400 than those for normal retention memory groups (and less than those for low retention memory groups). Therefore, the refresh address sequencer 500 generates refresh row addresses of the memory groups including low retention rows more frequently than refresh row addresses of the memory groups including high retention rows during one refresh period.

In some embodiments, the refresh sequence buffer 400 may be implemented with static memory (e.g., SRAM) that does not to be refreshed. In some embodiments, the refresh sequence buffer 400 may be implemented with dynamic memory (for example, DRAM) that should be refreshed. When the refresh sequence buffer 400 is implemented with a static memory or dynamic memory device, the volatile memory device 200a may further include nonvolatile memory that stores contents to be loaded and stored in the refresh sequence buffer 400. The contents stored in the nonvolatile memory device may be loaded to the refresh sequence buffer 400 during a power-up sequence of the volatile memory device 200a. In some embodiments, the refresh sequence buffer 400 may be implemented with nonvolatile memory such as flash memory or a one-time programmable memory, such as a fuse array. In addition, in some examples, the control logic circuit 210 and/or the memory controller 100 may access the refresh sequence buffer 400 and the contents stored in the refresh sequence buffer 400 may be updated.

Figure 5:
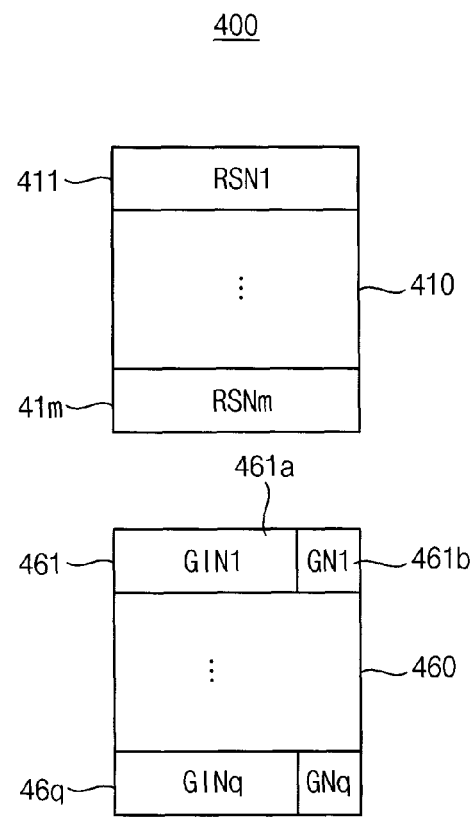
FIG. 5 is a block diagram illustrating an example of the refresh sequence buffer in FIG. 4 according to some embodiments.

FIG. 5 is a block diagram illustrating an example of the refresh sequence buffer 400 in FIG. 4 according to some embodiments.

Referring to FIG. 5, the refresh sequence buffer 400 may include a refresh sequence table 410 and a group table 460.

The refresh sequence table 410 includes a plurality of rows 411~41m (where, m is an integer greater than one), each of the rows 411~41m may correspond to each of refresh sequence nodes RSN1~RSNm. Each of the refresh sequence nodes RSN1~RSNm may include one or more refresh addresses identifying a corresponding memory group as an entry. Each row of the refresh sequence table 410 may include a refresh timing associated with a corresponding refresh sequence node RSN1~RSNm. Alternatively, the row position (or entry position) within the refresh sequence table 410 may indicate a refresh timing associated with a corresponding refresh sequence node RSN1~RSNm.

The group table 460 includes a plurality of rows 461a~461q (where, q is an integer greater than one), each of the rows 461a~461q may constitute an entry of the group table 40 and store one of group information nodes GIN1~GINq, 461a and a corresponding one of group indices GN1~GNq, 461b for each memory group. Each of group information nodes GIN1~GINq may identify each memory group, such as by including the refresh addresses of the corresponding memory group. Each of group indices GN1~GNq corresponding to an associated group information nodes (one of GIN1~GINq) identifies a refresh period for the memory group corresponding to the group information node.

In some embodiments, the refresh sequence buffer 400 does not include the group table 460. In some embodiments, the refresh sequence buffer 400 may implement the group table 460 in a non-volatile memory, such as a one-time programmable memory (e.g., fuse array) or flash memory. The refresh sequence table 410 may be implemented in a volatile memory, and its information may be generated and loaded (e.g., during a power up sequence) by referencing the information stored in the group table 460. When the refresh sequence buffer 400 only includes the refresh sequence table 410 not the group table 460, each of the refresh sequence nodes RSN1~RSNm entry may include refresh addresses of the corresponding memory group and associated refresh timing. When each of the refresh sequence nodes RSN1~RSNm includes a group index indicating each of rearranged memory groups and a refresh timing, the refresh sequence buffer 400 may include both of the refresh sequence table 410 and the group table 460.

FIG. 6 illustrates an example of the group table in FIG. 5 according to some embodiments.

Referring to FIG. 6, a group table 460a includes a plurality of rows, each row constituting an entry of the group table 460a. Each row stores addresses RA0~RA99, RA100~RA199, RA200~RA299 and RA300~RA399 identifying respective ones of memory groups (MG) G0, G1, G2 and G3. Each row stores a minimum refresh period (MRRP) 2×, 0.5×, 1× and 2× required for the one of memory groups G0, G1, G2 and G3 corresponding to the group table 460a entry. Each minimum refresh periods (MRRP) of the memory groups G0, G1, G2 and G3 stored in the group table 460a may be determined by testing of the volatile memory device 200a during manufacturing process of the volatile memory device 200a. Alternatively and/or in addition, testing of the volatile memory device 200a may be performed after manufacturing, such as by a self test, or a system test (using memory controller 100) to identify appropriate minimum refresh periods MRRP of the memory groups G0, G1, G2 and G3.

In FIG. 6, the first entry of group table 460a identifies a memory group G0 to include memory cell rows identified by the row addresses RA0~RA99. The first entry of group table 460a also indicates that the memory group G0 properly maintains stored data when the memory group G0 is refreshed with a refresh period that is two times longer than a standard refresh period. The standard refresh period may be a predetermined refresh period, such as a refresh period defined by a specification or standard. The memory group G1 includes the addresses RA100~RA199 of the memory cell rows and the memory group G1 is indicated to properly maintain stored data when the memory group G1 is refreshed with a refresh period which is half the standard refresh period. The memory group G2 includes the addresses RA200~RA299 of the memory cell rows and the memory group G2 is indicated to properly maintain stored data when the memory group G2 is refreshed with the standard refresh period. The memory group G3 includes the addresses RA300~RA399 of the memory cell rows and the memory group G3 maintains stored data when the memory group G3 is refreshed with a refresh period which is two times longer than the standard refresh period.

FIG. 7 illustrates an example of the refresh sequence table in FIG. 5 according to some embodiments.

FIG. 7 illustrates an example of the refresh sequence table in FIG. 5 when the memory cell rows are grouped into the memory groups G0~G3 as illustrated in FIG. 6.

Referring to FIG. 7, the refresh sequence table 410a stores rearranged memory groups G0, G1, G2, G1, G3, G1, G2, G1 and G0 according to refresh timings T1~T100, T101~T200, T201~T300, T301~T400, T401~T500, T501~T600, T601~T700, T701~T800 and T801~T900 respectively when the memory cell rows are grouped into the memory groups G0~G3 according to data retention characteristics as illustrated in FIG. 6. The refresh address sequencer 500 may generate the refresh row addresses REF_ADDR in an order of the arrangement of the memory groups as shown in FIG. 7. For example, the refresh row addresses REF_ADDR may be generated in the sequence of the sequence information SI, resulting in refresh row address REF_ADDR generation of RA0, RA1 . . . RA99 for timings T1~T100, RA100, RA101, . . . RA199 for timings T101~T200, RA200, RA201, . . . RA299 for timings T201~T300, RA100, RA101, . . . RA199 for timings T301~T400, etc. The refresh sequence over one refresh period for the entire device (and/or for groups G0~G3) may be completed at timing T800 and the refresh sequence may start repeating itself at timing T801 (i.e., refresh row addresses generated at timings T801~T1600 may be the same as refresh row addresses REF_ADDR generated in timings T1~T800 , respectively). It should be noted that timings T1~T900 may not be evenly spaced. For example, refresh row addresses RA0~RA99 generated at timings T1~T100 may be generated in a burst fashion after the memory device 200a receives a refresh command REF from memory controller 100. Then, there may be a delay for generating refresh row address RA100 until a second refresh command REF is received from memory controller (that would results in generating refresh row addresses RA100~RA199 in burst fashion during timings T101~T200). The interval between generation of sequential refresh row addresses may be in the order of tens of nanoseconds (e.g., 60 ns or less, or 90 ns or less) when generating refresh row addresses in burst fashion, corresponding to a required minimum time delay between sequential refresh operations to allow completion of a previous refresh operation before initiating a subsequent refresh operation. The delay between generation of sequential refresh addresses whose generation is responsive to different refresh commands REF (e.g., a delay between refresh address RA99 RA100) may be in the order of several microseconds, such as about 3.9 us or 7.8 us (e.g., between 2 to 10 us). The memory device 200a may regularly receive refresh commands REF distributed over the refresh period of the memory device 200a (e.g., 64 milliseconds, or 96 milliseconds). Each received refresh command REF may act to generate plural refresh row addresses to cause refresh of the same. Alternatively, the memory device may receive a self refresh entry command (SRE). In response to the self refresh entry command (SRE), the memory device 200a may generate the refresh row addresses according to the sequence information SI, (whose generation may have a timing similar to that described above or may all be evenly distributed over the refresh period at regular intervals). In FIG. 7, a refresh timing RP required for each of the memory groups is illustrated for convenience of explanation and a column for the refresh timing RP may not be included in the refresh sequence table 410a. The order of the memory groups G0, G1, G2, G1, G3, G1, G2, G1 and G0 corresponds to one refresh sequence, and each of the memory groups G0~G3 is at least once refreshed during one refresh sequence. In FIG. 7 SI denotes sequence information.

In FIGS. 6 and 7, an order of the sequence nodes of the refresh sequence table 410a includes refresh period information of the memory cell groups G0~G3 in FIG. 6, the group table 460a of FIG. 6 may not include a column for the minimum refresh periods (MRRP) required memory groups G0, G1, G2 and G3, which will be the same for below-mentioned group tables.

Figures 8, 9:
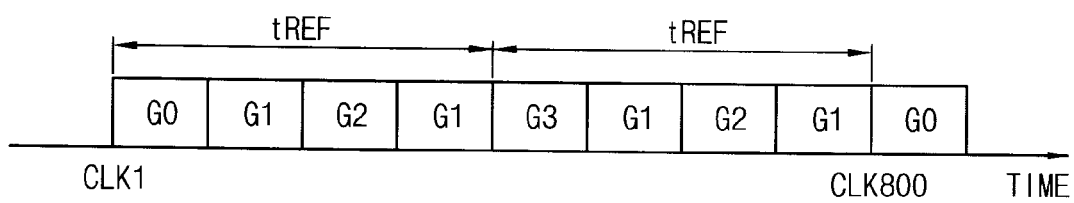
FIG. 8 illustrates another example of the refresh sequence table in FIG. 5 according to some embodiments.
FIG. 9 is a timing diagram illustrating that the memory cell rows are refreshed according to the refresh sequence table of FIG. 7.

FIG. 8 illustrates another example of the refresh sequence table in FIG. 5 according to some embodiments.

FIG. 8 illustrates an example of the refresh sequence table in FIG. 5 when the memory cell rows are grouped into the memory groups G0~G3 as illustrated in FIG. 6.

Referring to FIG. 8, the refresh sequence table 410b stores rearranged memory groups, each designated by a start address SA and an end address EA according to refresh timings T1~T100, T101~T200, T201~T300, T301~T400, T401~T500, T501~T600, T601~T700, T701~T800 and T801~T900 respectively when the memory cell rows are grouped into the memory groups G0~G3 according to data retention characteristics as illustrated in FIG. 6. The memory group G0 is designated a start address RA0 and an end address RA99, the memory group G1 is designated a start address RA100 and an end address RA199, and the memory group G2 is designated a start address RA200 and an end address RA299. In FIG. 8, a group size GS of the each of rearranged memory groups is illustrated for convenience of explanation and a column for the group size GS may not be included in the refresh sequence table 410b. In addition, when the group size GS for each memory group has a fixed value, each of the memory groups G0~G3 may be designated by a representative address of the addresses of each of the memory groups G0~G3. The fixed value of the group size GS for each memory group may be predetermined. The fixed value of the group size GS for each memory group may be programmable.

FIG. 9 is a timing diagram illustrating that the memory cell rows are refreshed according to the refresh sequence table of FIG. 7.

Referring to FIG. 9, it is noted that the addresses of the memory cell rows included the memory groups are refreshed according to the order of the rearranged memory groups G0, G1, G2, G1, G3, G1, G2, G1 and G0 in the refresh sequence table 410a in FIG. 7. During first standard refresh period tREF, the memory groups G0, G1, G2, G1 are sequentially refreshed and during next standard refresh period tREF, the memory groups G3, G1, G2, G1 are sequentially refreshed. While clock signal increments from CLK1 to CLK800, the memory group G1 whose refresh period is twice shorter than the standard refresh period tREF is refreshed four times, the memory group G2 whose refresh period is same as the standard refresh period tREF is refreshed two times, and the memory groups G0 and G3 whose refresh periods are twice longer than the standard refresh period tREF are refreshed once. Therefore, the volatile memory device according to example embodiments may reduce current consumption and refresh overhead by grouping the memory cell rows into the memory groups based on the data retention characteristics, arranging the memory groups according to the data retention characteristics and refreshing the memory cell rows according to an order of the arranged memory groups.

Figures 10, 11:
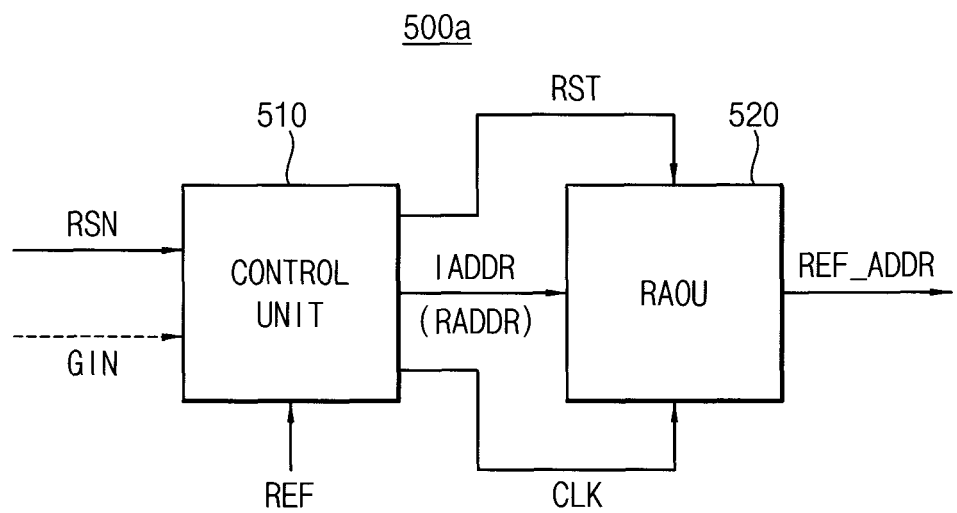
FIG. 10 is a block diagram illustrating an example of the refresh address sequencer in FIG. 4 according to some embodiments.
FIG. 11 illustrates another example of the group table in FIG. 5 according to some embodiments.

FIG. 10 is a block diagram illustrating an example of the refresh address sequencer in FIG. 4 according to some embodiments.

Referring to FIG. 10, a refresh address sequencer 500a includes a control unit 510 and a refresh address output unit circuit (RAOU) 520.

The control unit 510 receives contents stored in the refresh sequence node RSN of the refresh sequence table 410 and provides an initial row address IADDR or a representative row address RADDR of a memory cell row and a clock signal CLK based on the refresh timing stored in the refresh sequence node RSN. Here, the initial row address IADDR indicates the start address of the memory cell row of the memory group stored in the refresh sequence node RSN and the representative row address RADDR represents a corresponding memory group. The RAOU 520 outputs refresh row address REF_ADDR which starts as the initial row address IADDR and gradually increments from the initial row address IADDR in synchronization with the clock signal CLK. In addition, the control unit 510 provides a reset signal RST for resetting the RAOU 520. Resetting the RAOU 520 with reset signal RST may act to load the initial row address IADDR to the RAOU 520—that is the counter of the RAOU 520 may be loaded with the value of the initial row address IADDR currently applied to the RAOU 520 by the control unit 510 upon application of the reset signal RST to the RAOU 520. The reset signal RST and an updated initial row address IADDR may be applied by the control unit 510 to the RAOU 520 to initiate a refresh of a new memory group. In addition, the control unit 510 may receive the contents of the group information node GIN to the initial row address IADDR when the group index is stored in the refresh sequence node. The control unit 510 provides the clock signal CLK to the RAOU 520. The RAOU 520 may be implemented with a counter or a look-up table.

FIG. 11 illustrates another example of the group table in FIG. 5 according to some embodiments.

Referring to FIG. 11, a group table 460b comprises a plurality of rows. The rows of group table 460b store addresses RA0~RA99, RA100~RA199, RA200~RA299 and RA300~RA399 of memory groups G0, G1, G2 and G3, minimum refresh periods (MRRP) 2×, 0.5×, 1× and 2× required for the memory groups G0, G1, G2 and G3 and exceptional addresses RA20, RA50 and RA60 of the exceptional memory cell rows of at least one memory group as entries (here, RA20, RA50 and RA60 are all memory cell rows of memory group G0). The exceptional addresses RA20, RA50 and RA60 of the exceptional memory cell rows of at least one memory group G0 does not satisfy corresponding MRRP of the memory group G0. For example, the memory cell rows of addresses RA20, RA50 and RA60 may require refresh operations more frequently than the remaining memory cell rows of memory group G0. In this example, the memory cell groups G1, G2, G3 do not include exceptional memory cell rows, but may according to results of testing (e.g., during manufacturing). Although the exceptional addresses RA20, RA50 and RA60 of the exceptional memory cell rows belong to the memory group G0 whose refresh period is twice longer than the standard refresh period (1×), the address RA20 of the exceptional memory cell row needs to be refreshed with standard refresh period (1×), the address RA50 of the exceptional memory cell row needs to be refreshed with standard refresh period (1×), and the address RA60 of the exceptional memory cell row needs to be refreshed with refresh period (0.5×) twice shorter than the standard refresh period (1×).

Figure 12:
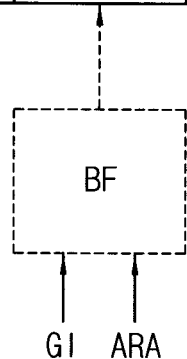
FIG. 12 illustrates another example of the refresh sequence table in FIG. 5 according to some embodiments.

FIG. 12 illustrates another example of the refresh sequence table in FIG. 5 according to some embodiments.

FIG. 12 illustrates an example of the refresh sequence table in FIG. 5 when the memory cell rows are grouped into the memory groups G0~G3 as illustrated in FIG. 11. In some examples, refresh sequence table 410c may be implemented in non-volatile memory of the memory device 200a as an alternative to group table 460c of FIG. 11. In other examples, refresh sequence table 410c may be implemented in volatile memory of the memory device 200a, and may be constructed from information of the group table 460c (which may be implemented in non-volatile memory).

Referring to FIG. 12, the refresh sequence table 410c stores an arrangement of memory groups as G0, G1, G2, G1, G3, G1, G2, G1 and G0 according to refresh timings T1~T100, T101~T200, T201~T300, T301~T400, T401~T500, T501~T600, T601~T700, T701~T800 and T801~T900 respectively when the memory cell rows are grouped into the memory groups G0~G3 according to data retention characteristics as illustrated in FIG. 11. Entries of the memory group G1 further includes an exceptional address of the memory cell row RA60 belonging to the memory group G0 as additional row address ARA and Entries of the memory group G2 further includes exceptional addresses RA20 and RA50 of the memory cell rows belonging to the memory group G0 as ARA. When at least one address of at least one exceptional memory cell row is written as the ARA in the refresh sequence table 410c, the least one address of at least one exceptional memory cell row is refreshed simultaneously with a different memory group than the memory group to which the exceptional memory cell row belongs. In this example, the exceptional memory cell rows are associated (via the refresh sequence table 410c entry) with different memory groups whose data retention characteristic is same as the exceptional memory cell rows. Therefore, refresh overhead may be reduced. The refresh address sequencer 500 may generate additional refresh row addresses corresponding to the exceptional memory cell rows provided in the additional row address ARA portion of the entry of the refresh sequence table 410c while generating the refresh row addresses REF_ADDR of the memory cell group of the corresponding entry of the refresh sequence table 410c (i.e., the memory cell group identified by the sequence information SI portion of the refresh sequence table 410c entry associated with the additional row address ARA). For example, after generating the refresh row addresses REF_ADDR of all the row addresses of a memory cell group identified by the sequence information SI of a refresh sequence table 410c entry, the additional row address(es) of that entry may be generated. Taking the second entry of refresh sequence table 410c as one example, control unit 510 of FIG. 10 may provide row address RA100 as the initial row address IADDR with a reset signal RST to RAOU 520 to cause row address RA100 to be loaded into a counter of RAOU 520. Thereafter, the control unit 510 may apply a clock signal CLK to the RAOU 520 to cause RAOU 520 to output row addresses RA100~RA199 as refresh row addresses REF_ADDR. The control unit 510 may then detect in the second entry of the refresh sequence table 410c the existence of a listing of an additional row address ARA, here, RA60. The control unit 510 may then provide row address RA60 as the initial refresh address IADDR with a reset signal RST to RAOU 520 to cause row address RA60 to be loaded and output from RAOU 520 (RA60 output from control unit 520 to RAOU 520 may simply be considered a refresh address RADDR as this additional row address ARA is not associated with any incrementing of the RAOU 520). If more than one additional row address ARA is provided in the entry of the refresh sequence table 410c, the control unit 510 may continue this process of loading these additional row addresses ARA into RAOU 520 for output as a row refresh address REF_ADDR, causing the associated memory cell row to be refreshed. The order of providing the additional row addresses ARA to the RAOU 520 may be other than that described in this example—the control unit 510 may provide these additional row addresses to the RAOU 520 prior to providing the initial row address IADDR of the memory group of the associated entry of the refresh sequence table 410c. In addition, it should be noted that the timings of the refresh sequence table 410c may not reflect a timing for refresh operations of the additional row addresses. For example, the refresh (or generation of the refresh address) of RA60 memory cell row may occur at a time between T100 and T101. In FIG. 12, a refresh timing RP required for each of the rearranged memory groups is illustrated for convenience of explanation and a column for the refresh timing RP may not be included in the refresh sequence table 410c. The order of the rearranged memory groups G0, G1, G2, G1, G3, G1, G2, and G1 may correspond to one refresh sequence, and each of the memory groups G0~G3 is at least once refreshed during one refresh sequence. The refresh sequence may start again at timings T801~T900 with the generation of refresh addresses of memory cell group G0. The refresh sequence may be repeated periodically at regular intervals.

When a bloom filter BF is used, the group index GI and the additional refresh address ARA are passed through the bloom filter BF, and an output of the bloom filter BF is stored in a column for the additional refresh address ARA. When the refresh operation is performed on each memory group, it is confirmed that the memory group includes at least one additional refresh address ARA when the output of the bloom filter BF is positive.

Figure 13:
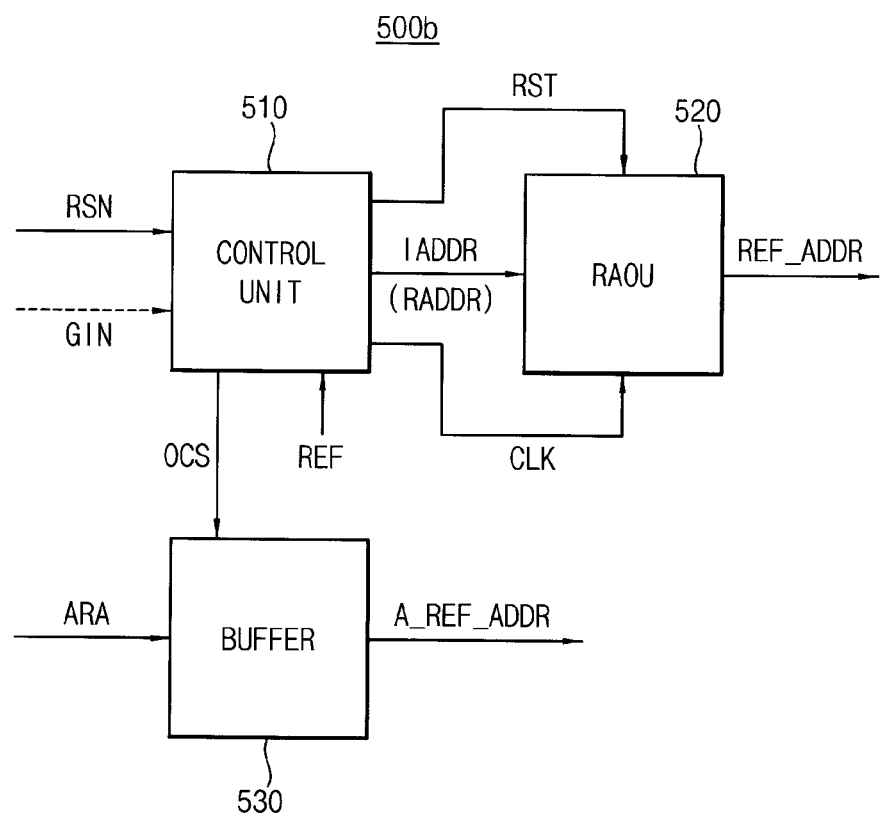
FIG. 13 is a block diagram illustrating another example of the refresh address sequencer in FIG. 4 according to some embodiments.

FIG. 13 is a block diagram illustrating another example of the refresh address sequencer in FIG. 4 according to some embodiments.

Referring to FIG. 13, a refresh address sequencer 500b includes a control unit 510, a RAOU 520 and a buffer 530.

The control unit 510 receives contents stored in the refresh sequence node RSN of the refresh sequence table 410c of FIG. 12 and provides the initial row address IADDR or the representative row address RADDR of a memory cell row and the clock signal CLK based on the refresh timing stored in the refresh sequence node RSN. The RAOU 520 outputs refresh row address REF_ADDR which gradually increments from the initial row address IADDR or output the row addresses belonging to each memory group based on the representative row address RADDR as the refresh row address REF_ADDR in synchronization with the clock signal CLK. In addition, the control unit 510 may receive the contents of the group information node GIN to the initial row address IADDR and the clock signal CLK to the RAOU 520 when the group index is stored in the refresh sequence node. The buffer 530 stores the additional refresh address ARA and may output the additional refresh address ARA as the additional refresh row address A REF_ADDR in response to an output control signal OCS when the refresh row address of the memory group whose data retention time is same as the memory cell row of the additional refresh address ARA. In addition, the control unit 510 provides a reset signal RST for resetting the RAOU 520 when the RAOU 520 outputs last refresh row address of the memory group of the rearranged memory groups. In addition, the control unit 510 may receive the contents of the group information node GIN to the initial row address IADDR and the clock signal CLK to the RAOU 520 when the group index is stored in the refresh sequence node.

Figure 14:
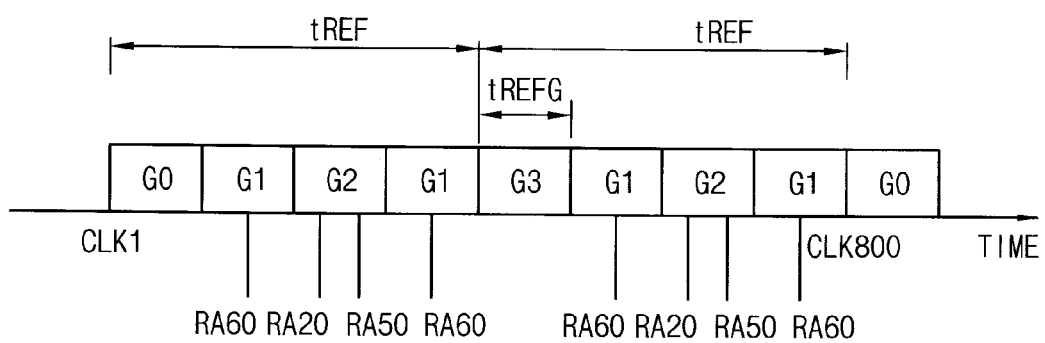
FIG. 14 is a timing diagram illustrating that the memory cell rows are refreshed according to the refresh sequence table of FIG. 12.

FIG. 14 is a timing diagram illustrating that the memory cell rows are refreshed according to the refresh sequence table of FIG. 12.

Referring to FIG. 14, it is noted that the addresses of the memory cell rows included the memory groups are refreshed according to the order of the rearranged memory groups G0, G1, G2, G1, G3, G1, G2, G1 and G0 in the refresh sequence table 410c in FIG. 12. During first standard refresh period tREF, the memory groups G0, G1, G2, G1 are sequentially refreshed and during next standard refresh period tREF, the memory groups G3, G1, G2, G1 are sequentially refreshed. While the memory group G1 is refreshed, the memory cell row corresponding to the additional refresh address RA60 is also refreshed, and while the memory group G2 is refreshed, the memory cell rows corresponding to the additional refresh addresses RA20 and RA50 are refreshed. While clock signal increments from CLK1 to CLK800, the memory group G1 whose refresh period is half of the standard refresh period tREF is refreshed four times, the memory group G2 whose refresh period is same as the standard refresh period tREF is refreshed two times, and the memory groups G0 and G3 whose refresh periods are two times longer than the standard refresh period tREF are refreshed once. Therefore, the volatile memory device according to example embodiments may reduce current consumption and refresh overhead by grouping the memory cell rows into the memory groups based on the data retention characteristics, arranging the memory groups according to their data retention characteristics and refreshing the memory cell rows according to an order of the rearranged memory groups. In addition, exceptional memory cell rows that require additional refresh operations as compared to other memory cell rows of their memory group may have additional refresh operations performed with the refresh of other memory groups.

FIG. 15 illustrates another example of the group table in FIG. 5 according to some embodiments.

Referring to FIG. 15, a group table 460c a plurality of rows and the rows stores addresses RA0~RA49, RA50~RA99, RA100~RA149, RA150~RA199, RA200~RA249, RA250~RA299, RA300~RA349 and RA350~RA399 of memory groups G0, G1, G2, G3, G4, G5, G6 and G7, minimum refresh periods (MRRP) 2×4×, 0.5×, 1×, 4×, 4×, 4× and 4× required for the memory groups G0, G1, G2, G3, G4, G5, G6 and G7 and exceptional addresses RA20, RA50, RA60 and RA70 of the exceptional memory cell rows of at least some memory groups G0 and G1 respectively in the memory groups G0, G1 and G3 as entries. The memory cell groups G2 and G4~G7 do not include exceptional memory cell rows. When compared with FIG. 11, each of the memory groups G0~G7 includes 50 memory cell rows in FIG. 15. Although the exceptional address RA20 of the exceptional memory cell rows belong to the memory group G0 whose refresh period is twice as long as the standard refresh period (1×), the address RA20 of the exceptional memory cell row may be to be refreshed with the standard refresh period (1×). Although the exceptional addresses RA50 and RA60 of the exceptional memory cell rows belong to the memory group G1 whose refresh periods are four times longer than the standard refresh period (1×), the address RA50 of the exceptional memory cell row should be refreshed with a standard refresh period (1×) and the address RA60 of the exceptional memory cell row should be refreshed with a refresh period twice as long as the standard refresh period (1×). Although the exceptional address RA70 of the exceptional memory cell rows belong to the memory group G1 whose refresh period is four times longer than the standard refresh period (1×), the address RA70 of the exceptional memory cell row should be refreshed with a refresh period that his half of the standard refresh period (1×).

FIG. 16 illustrates another example of the refresh sequence table in FIG. 5 according to some embodiments.

FIG. 16 illustrates an example of the refresh sequence table in FIG. 5 when the memory cell rows are grouped into the memory groups G0~G7 as illustrated in FIG. 15.

Referring to FIG. 16, the refresh sequence table 410d stores rearranged memory groups G2, G3, G1, G4, G2 at refresh timings T1~T50, T51~T 100, T101~T150, T151~T200 and T201~T250 respectively, stores additional refresh addresses RA20 and RA50 at refresh timing T251~T300, stores no memory groups at refresh timings T301~T350 and T351~T400, stores rearranged memory groups G2, G3, G7, G0 and G2 at refresh timings T401~T450, T451~T500, T501~T550, T551~T600 and T601~T650 respectively, stores additional refresh addresses RA20 and RA50 at refresh timing T651~T700, stores no memory groups at refresh timings T701~T750 and T751~T800, stores rearranged memory groups G2, G3, G6 at refresh timings T801~T850, T851~T900, and T901~T950 respectively, stores no memory group at refresh timing T951~T1000, stores rearranged memory group G2 at refresh timing T1001~T1050, stores additional refresh addresses RA20 and RA50 at refresh timing T1051~T1100, stores no memory groups at refresh timings T1101~T1150 and T1151~T1120, stores rearranged memory groups G2, G3, G7, G0 and G2 at refresh timings T1201~T1250, T1251~T1300, T1301~T1350, T1351~T1400 and T1401~T1450 respectively, stores additional refresh addresses RA20 and RA50 at refresh timing T1451~T1500 and stores no memory groups at refresh timings T1501~T1550 and T1551~T1600 when the memory cell rows are grouped into the memory groups G0~G7 according to data retention characteristics as illustrated in FIG. 15. Entry of the memory group G2 further includes an exceptional address RA170 of the memory cell row belonging to the memory group G4 as additional row address ARA and entry of the memory group G0 further includes exceptional address RA60 of the memory cell row belonging to the memory group G3 as ARA. At least one address of at least one exceptional memory cell row is written as the ARA in the refresh sequence table 410d, and the least one address of at least one exceptional memory cell row is refreshed simultaneously with memory group whose data retention characteristic is same as the exceptional memory cell row. Therefore, refresh overhead may be reduced.

The refresh address sequencer 500 may generate additional refresh row address corresponding to the exceptional memory cell rows while generating the refresh row addresses REF_ADDR in an order of the rearranged memory groups based on the addresses of the memory cell rows in each memory group according to the order of the rearranged memory groups and the refresh timing. In FIG. 16, a refresh timing RP required for each of the rearranged memory groups is illustrated for convenience of explanation and a column for the refresh timing RP may not be included in the refresh sequence table 410d. When compared with the refresh sequence table of FIG. 12, each of the memory groups G0~G7 includes 50 memory cell rows in FIG. 16 while each of the memory groups G0~G3 includes 100 memory cell rows in FIG. 12. That is, when the number of the memory cell row in one memory group increases, the quantity of data stored in the refresh sequence table may also increase. However, when the number of the memory cell row in one memory group increases, refresh operation is enough performed on the memory cell row corresponding to the addition row address at refresh timing T501~T300 and current consumption may be reduced with no memory groups being allocated at refresh timings T301~T350 and T351~T400.

In some memory circuits, memory layouts may allow for simultaneously refreshing different memory cell rows simultaneously (e.g., rows in different memory banks that may operate simultaneously, and when rows in a same bank are read using different sense amplifier banks and do not share bit lines). In some memory layouts, it may not be possible to refresh different memory cell rows simultaneously. However, when there is enough time for performing plural sequential refresh operations in response to one externally received refresh signal REF (for example, refer to group refresh period tREFG in FIG. 14), different memory cell rows may be consecutively refreshed during the refresh operation in response to one refresh signal REF. In addition, different memory cell rows such as the memory cell row corresponding to the additional refresh address and the memory group having the additional refresh address as entry may be simultaneously refreshed, when the memory cell row corresponding to the additional refresh address and the memory group having the additional refresh address as entry may be refreshed in parallel. For example, when memory cell row corresponding to the additional refresh address and the memory group having the additional refresh address as entry do not share a bitline sense amplifier such as when their wordlines are not in a same memory cell array, they may be refreshed simultaneously.

FIG. 17 a table illustrating relations of memory cell rows which are simultaneously refreshed in response to one refresh signal.

In FIG. 17, temporal slot denotes the number of consecutive refresh operation in response to one refresh signal and spatial slot denotes memory blocks which are spatially separate and refreshable simultaneously.

Referring to FIG. 17, memory cell rows which are simultaneously refreshable are represented as refresh slots RS[1, 1]~RS[j, k].

When the group size of the memory groups that are grouped according to data retention characteristics is smaller than the size of the memory block in FIG. 17, the memory cell row corresponding to the additional refresh address and the memory group having the additional refresh address as entry may not share a bitline sense amplifier such as when their wordlines are not in the same memory cell array, and/or when their wordlines are in different memory banks that may be operated in parallel.

The table of FIG. 17 may be further stored in the refresh sequence buffer 400 in FIG. 4, or the table of FIG. 17 may be included in the refresh address generator 300 in FIG. 3 separately from the refresh sequence buffer 400.

FIG. 18 illustrates another example of the group table in FIG. 5 according to some embodiments.

Referring to FIG. 18, a group table 460d includes a plurality of rows and the rows stores group index 0~3 indicating memory cell groups G0~G3 respectively, addresses RA0~RA99, RA100~RA199, RA200~RA299 and RA300~RA399 of memory groups G0, G1, G2 and G3 and minimum refresh periods (MRRP) 2×, 0.25×, 4× and 0.5× required for the memory groups G0, G1, G2 and G3 respectively as entries.

In FIG. 18, the group index 0 includes the addresses RA0~RA99 of the memory cell rows and the memory cell rows having the group index 0 maintain stored data when the memory cell rows having the group index 0 are refreshed with a refresh period which is twice as long as a standard refresh period which is defined by a specification. The group index 1 includes the addresses RA100~RA199 of the memory cell rows and the memory cell rows having the group index 1 maintain stored data when the memory cell rows having the group index 0 are refreshed with a refresh period which is one fourth of the standard refresh period. The group index 2 includes the addresses RA200~RA299 of the memory cell rows and the memory cell rows having the group index 2 maintain stored data when the memory cell rows having the group index 2 are refreshed with a refresh period four times that of the standard refresh period. The group index 3 includes the addresses RA300~RA399 of the memory cell rows and the memory cell rows having the group index 3 maintain stored data when the memory cell rows having the group index 2 are refreshed with a refresh period which half the standard refresh period. In FIG. 18, when the group index has a value obtained by dividing each start address of the memory group by the size of the memory group, the quantity of data to be stored in the group table 460d or the refresh sequence table may be reduced.

FIG. 19 illustrates an example of the refresh slot table of FIG. 17 according to some embodiments.

A refresh slot table of FIG. 17 illustrates refresh slots that are refreshed during the same refresh periods when the memory cell rows are grouped according to the group table of FIG. 18. The rows of the groups indicated by indices in the first and second slots may be refreshed simultaneously or in series during the associated time periods (such as refresh one group followed by the other, or by alternating refresh operations for each group).

In FIG. 19, first and second slots SLOT1 and SLOT2 denote refresh slots that are simultaneously refreshable in FIG. 18 and column entries of the first and second slots SLOT1 and SLOT2 denote group indices in FIG. 18 respectively.

Referring to FIG. 18, the memory group G1 indicated by the group index 1 has the refresh period which is four times shorter than the standard refresh period. Therefore, the memory groups corresponding to the group indices 0 and 3 are simultaneously refreshed at timing T1~T100, the memory groups corresponding to the group indices 1 and 0 are simultaneously refreshed at timing T101~T200, the memory groups corresponding to the group indices 1 and 3 are simultaneously refreshed at timing T201~T300, and the memory group corresponding to the group index 1 is refreshed at timing T301~T400. Similar refresh operations are preformed at times T401~T1600. The memory group G1 indicated by the group index 1 is refreshed at every timing because the memory group G1 indicated by the group index 1 has the shortest refresh period. In addition, only the memory group G1 indicated by the group index 1 is refreshed at timings T301~T400, T701~T800, T1101~T1200, T1301~T1400 and T1501~T1600.

FIG. 20 illustrates data retention characteristics of the memory cell array in FIG. 3.

Referring to FIG. 20, the memory cell rows corresponding to the row addresses RA100~RA149 maintain stored data when they are refreshed with minimum refresh period of 0.5× twice shorter than the standard refresh period 1×, the memory cell rows corresponding to the row addresses RA150~RA199 (except RA170) maintain stored data when they are refreshed with minimum refresh period of 1×, the memory cell rows corresponding to the row addresses RA0~RA49 (except RA20) maintain stored data when they are refreshed with minimum refresh period of 2× which is two times longer than the standard refresh period and the memory cell rows corresponding to the row addresses RA50~RA99 (except RA50 and RA 60), RA200~RA249, RA250~RA299, RA300~RA349 and RA350~RA399 maintain stored data when they are refreshed with minimum refresh period of 4× which is four times longer than the standard refresh period.

FIG. 21 illustrates another example of the group table in FIG. 5 according to some embodiments.

FIG. 21 illustrates an example of the group table when the memory cell rows in the memory cell array in FIG. 3 have the data retention characteristics as illustrated in FIG. 20. In addition, the memory cell rows in the memory cell array in FIG. 3 are grouped into 8 memory cell groups.

Referring to FIG. 21, a group table 460e includes a plurality of rows and the rows stores group index 0~7 indicating memory cell groups G0~G7 respectively, addresses RA0~RA49, RA50~RA99, RA100~RA149, RA150~RA199, RA200~RA249, RA250~RA299, RA300~RA349 and RA350~RA399 of memory groups G0~G7 and minimum refresh periods (MRRP) 2×, 4×, 0.5×, 1×, 4×, 4×, 4× and 4× required for the memory groups G0~G7 respectively as entries. In addition, some of the rows include additional refresh addresses RA60 and RA170 as entry. In addition, one the rows includes group index 8 and the additional refresh addresses RA20 and RA50 as entry.

FIG. 22 illustrates another example of the refresh sequence table in FIG. 5 according to some embodiments.

FIG. 22 illustrates an example of the group table when the memory cell rows in the memory cell array in FIG. 3 have the data retention characteristics as illustrated in FIG. 20 and are stored in the group table 460e in FIG. 21.

Referring to FIG. 22, when the memory cell rows are grouped and stored in the table 460e, the group indices are rearranged according to refresh timings T1~T1600 and stored in a refresh sequence table 410e as illustrated in FIG. 22. In this case, each of the group indices may denote the row addresses of memory cell rows of corresponding memory group and at least one additional refresh address in exists. When the refresh sequence table is constituted as in FIG. 22, the refresh address sequencer 500b of FIG. 13 may output the refresh row address REF_ADDR and the additional refresh row address A_REF_ADDR based on the contents stored in the group information node GIN. In addition, when the group table and the refresh sequence table are constituted as in FIGS. 21 and 22, each group information node may include irregular additional refresh address. In this case, the additional refresh addresses may be implemented with pointer array, and a pointer may designate at least one additional refresh address which can be included in the group information node.

FIG. 23 illustrates another example of the group table in FIG. 5 according to some embodiments.

FIG. 23 illustrates an example of the group table when the memory cell rows in the memory cell array in FIG. 3 have the data retention characteristics as illustrated in FIG. 20. In addition, the memory cell rows in the memory cell array in FIG. 3 are grouped into 8 memory cell groups.

Referring to FIG. 23, a group table 460f includes a plurality of rows and the rows stores group index 0~7 indicating memory cell groups G0~G7 respectively, addresses RA0~RA49, RA50~RA99, RA100~RA149, RA150~RA199, RA200~RA249, RA250~RA299, RA300~RA349 and RA350~RA399 of memory groups G0~G7 and dynamic refresh flag DRF indicating whether each memory group is refreshed or not respectively as entries. In addition, some of the rows include additional refresh addresses RA60 and RA170 as entry. In addition, one the rows includes group index 8 and the additional refresh addresses RA20 and RA50 as entry. In FIG. 23, logic level of dynamic refresh flag DRF determines whether the corresponding memory group is refreshed or not. In addition, in FIG. 23, the memory groups corresponding to the group indices 0, 3 and 7 whose dynamic refresh flags DRF are logic "0" are assumed to be temporarily not used. For example, it may be determined that no data is stored in the memory groups corresponding to group indices 0, 3, 7 and the dynamic refresh flag DRF corresponding to these memory group indices may be set to 0. The memory device may operate to skip refresh of these memory groups when they are otherwise scheduled by refresh sequence table (e.g., control unit 510 may detect the flag setting of 0 and respond to this flag setting by failing to provide a new initial row address IADDR and clock CLK to RAOU 520 during the scheduled group refresh (e.g., during a corresponding tREFG in FIG. 14). Dynamic refresh flag DRF settings may be changed when the memory groups are written to with data (e.g., changing 0 to 1 to indicate data is stored in the appropriate memory group)—this may be performed by the memory device in response to receiving a write command to a memory group that previously did not have data stored, or may be performed by receiving a command from the memory controller. Dynamic refresh flag DRF settings may be changed when the data stored in the memory group is no longer required (e.g., changing 1 to 0)—this may be performed by in response to receiving a command from a memory controller instructing the memory device that the data is no long required of a certain memory group. FIG. 24 illustrates another example of the refresh sequence table in FIG. 5 according to some embodiments.

FIG. 24 illustrates an example of the group table when the memory cell rows in the memory cell array in FIG. 3 have the data retention characteristics as illustrated in FIG. 20 and are stored in the group table 460f in FIG. 23.

Referring to FIG. 24, it is noted that the refresh operations are skipped on the memory groups corresponding to the group indices 0, 3 and 7 whose dynamic refresh flags DRF are logic "0". Although the refresh operation is skipped on the memory groups corresponding to the group indices 0, 3 and 7 whose dynamic refresh flags DRF are logic "0", the refresh operation is performed on the memory cell row corresponding to the additional refresh addresses.

FIGS. 25 and 26 illustrate examples of the refresh sequence table in FIG. 5 respectively according to some embodiments.

FIGS. 25 and 26 are for explaining that a refresh period of a memory group may be altered using the dynamic refresh flag DRF.

In the refresh sequence table of FIGS. 25 and 26, the dynamic refresh flag DRF is added to the refresh sequence table 410f of FIG. 22.

Referring to FIGS. 25 and 26, the dynamic refresh flag DRF of the group index 2 corresponds to logic high level in FIG. 25 and then converted to logic low level in FIG. 26 at refresh timings T201~T250, T601~T650, T1001~T1050 and T1401~T1450. When the dynamic refresh flag DRF of the group index 2 is converted at refresh timings T201~T250, T601~T650, T1001~T1050 and T1401~T1450, the refresh period of the memory group G2 corresponding to the group index 2 is altered from 0.5× to 1× of the standard refresh period.

Figure 27:
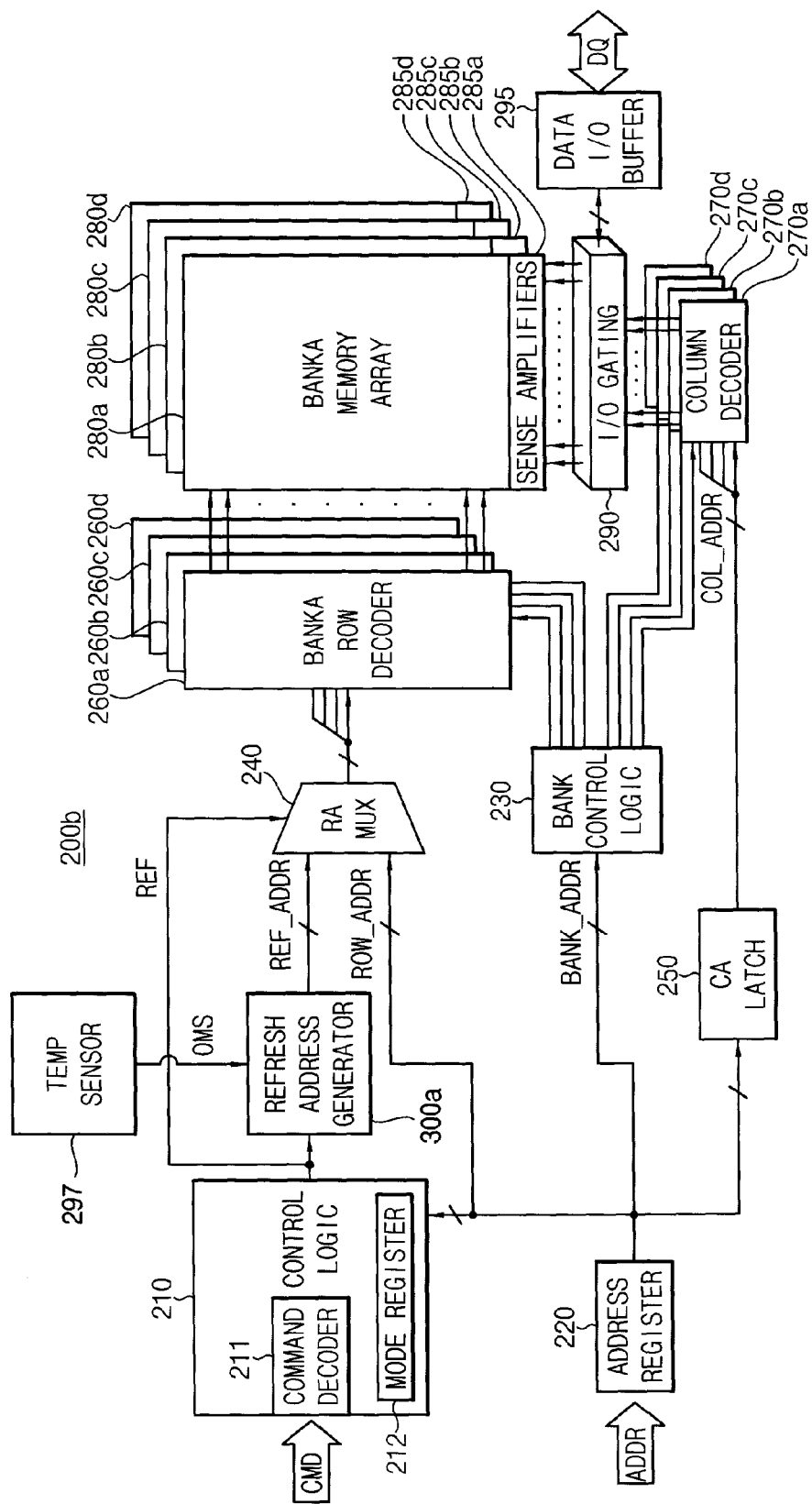
FIG. 27 is a block diagram illustrating another example of the memory device in FIG. 2 according to some example embodiments.

FIG. 27 is a block diagram illustrating another example of the memory device in FIG. 2 according to some example embodiments.

Referring to FIG. 27, the memory device 200b includes a control logic circuit 210, an address register 220, a bank control logic circuit 230, a row address multiplexer 240, a column address latch 250, a row decoder, a column decoder, a memory cell array, a sense amplifier unit, an input/output gating circuit 290, a data input/output buffer 295, a temperature sensor 297 and a refresh address generator 300a.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d, the column decoder may include first through fourth bank column decoders 270a, 270b, 270c and 270d respectively coupled to the first through fourth bank arrays 280a, 280b, 280c and 280d, and the sense amplifier unit may include first through fourth bank sense amplifiers 285a, 285b, 385c and 385d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the volatile memory device 200b is illustrated in FIG. 27 as including four banks, the volatile memory device 200b may include any number of banks.

In some embodiments, the volatile memory device 200b may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile memory devices that require a refresh operation.

The address register 220 may receive an address ADDR including a bank address BANK_ADDR, a row address ROW_ADDR and a column address COL_ADDR from a memory controller (not shown). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh address generator 297. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The input/output gating circuit 290 may include a circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295. Data DQ to be written to one bank array of the first through fourth bank arrays 280a, 280b, 280c and 280d may be provide from the memory controller to the data input/output buffer 295. The data DQ provided to the data input/output buffer 295 may be written to the one array bank via the write drivers of the input/output gating circuit 290.

The control logic circuit 210 may control operations of the memory device 200a. For example, the control logic circuit 210 may generate control signals for the memory device 200a to perform a write operation or a read operation. The control logic circuit 210 may include a command decoder 211 that decodes a command CMD received from the memory controller and a mode register 212 that sets an operation mode of the volatile memory device 200. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the volatile memory device 200b in a synchronous manner. In addition, the control logic circuit 210 may control the refresh address generator 300a to generate the refresh row address REF_ADDR.

The temperature sensor 297 senses operating temperature of the volatile memory device 200b and provides the refresh address generator 300a with the operation mode signal OMS according to the operating temperature.

The refresh address generator 300a generates a refresh row address REF_ADDR according to a refresh profiling which are pre-stored according to the operating temperature of the volatile memory device 200b in response to the operation mode signal OMS and provides the refresh row address REF_ADDR to the address multiplexer 240. That is, the volatile memory device 200b may generate refresh row address REF_ADDR according to different refresh sequences based on operation temperature.

Figure 28:
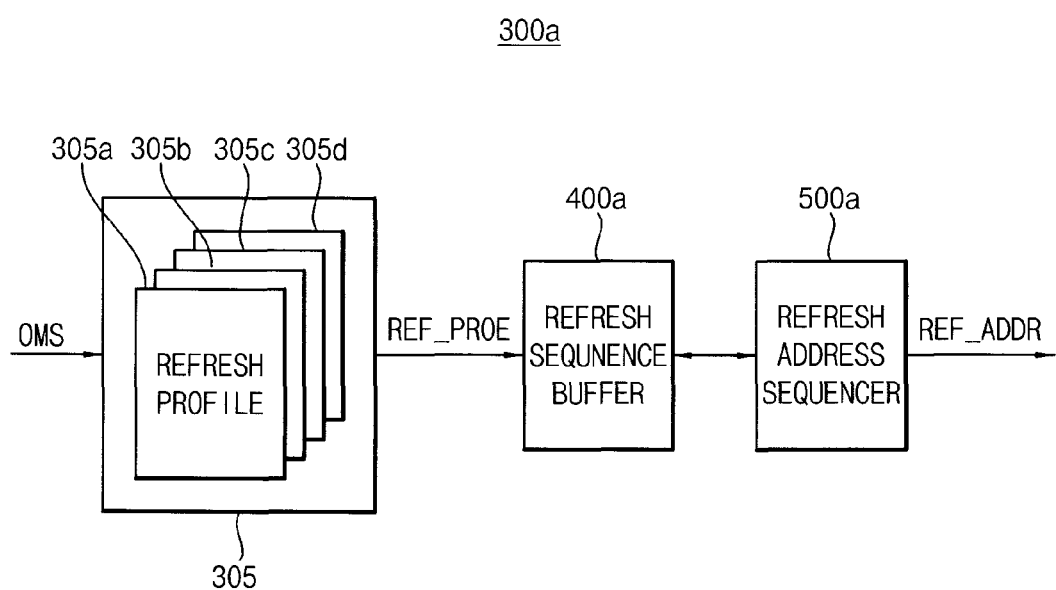
FIG. 28 is a block diagram illustrating an example of the refresh address generator in FIG. 27 according to some embodiments.

FIG. 28 is a block diagram illustrating an example of the refresh address generator in FIG. 27 according to some embodiments.

Referring to FIG. 28, a refresh address generator 300a includes a refresh profiling storing unit 305, a refresh sequence buffer 400a and a refresh address sequencer 500a.

The refresh profiling storing unit 305 includes a plurality of refresh profile tables 305a, 305b, 305c and 305d. Each of refresh profile tables 305a, 305b, 305c and 305d may include a refresh sequence table 410 and the group table 460 in FIG. 5, or may include a group table from which a refresh sequence table 410 may be derived. The refresh sequence table 410 and/or group table 460 of each profile table 305a, 305b, 305c and 305d may be generated after testing the memory device at a respective operating temperature of the memory device. Each profile table 305a, 305b, 305c and 305d correspond to a different operating temperature. The refresh sequence table and the group table in each of the refresh profile tables 305a, 305b, 305c and 305d may include refresh sequence and grouping information prepared according to the data retention characteristics based on the corresponding operating temperature in a test performed during manufacturing process. In response to the current operating temperature of the memory device, refresh profiling storing unit 305 loads to the refresh sequence buffer 400a contents REF_PROE of the appropriate refresh profile tables 305a, 305b, 305c and 305d corresponding to the operating temperature. Each of the refresh profile tables 305a, 305b, 305c and 305d may correspond to a range of operating temperatures and may be selected to output corresponding contents when the temperature of the memory device falls within its range. Operating mode signal OMS may be generated in response to the current temperature of the memory device and be used to select the appropriate refresh profile table 305a, 305b, 305c and 305d. The refresh address sequencer 500a may output refresh row address REF_ADDR according to the refresh sequence corresponding to the current operating temperature by referring to the contents stored in the refresh sequence buffer 400a. Other operating conditions other than or in addition to temperature may be used in selecting different refresh profile tables (which may include other environmental factors and/or factors regarding the type of operations being performed on the memory device by the memory controller).

In some embodiments, the refresh profiling storing unit 305 may be implemented with a static memory device which needs not to be refreshed. In some embodiments, the refresh profiling storing unit 305 may be implemented with a dynamic memory device (for example, DRAM) which should be refreshed. When the refresh profiling storing unit 305 is implemented with a volatile memory device, the volatile memory device 200b may further include a nonvolatile memory device which stores contents to be stored in the refresh profiling storing unit 305. The contents stored in the nonvolatile memory device may be loaded to the refresh profiling storing unit 305 during a power-up sequence of the volatile memory device 200b. In some embodiments, the refresh profiling storing unit 305 may be implemented with a nonvolatile memory device such as a flash memory device.

Figure 29:
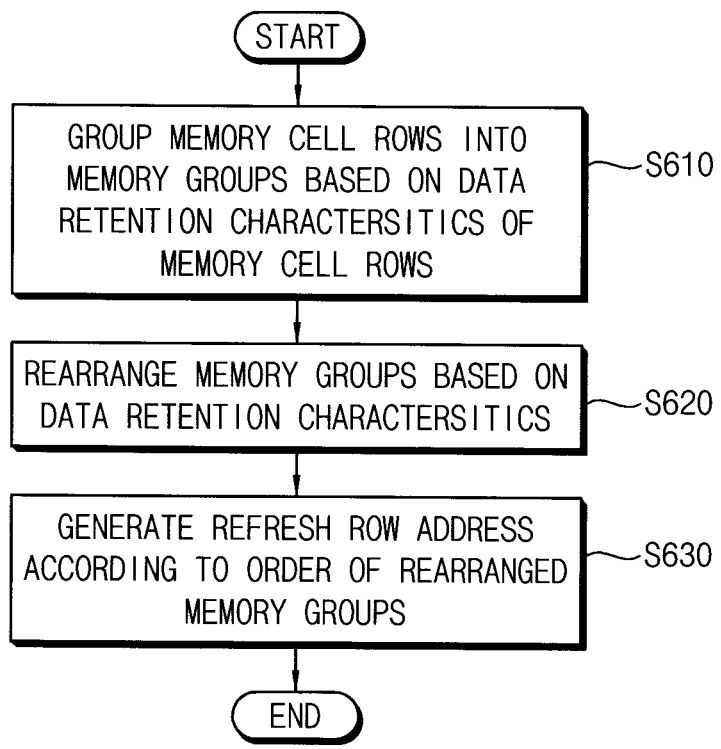
FIG. 29 is a flow chart illustrating a method of refreshing a volatile memory device according to some embodiments.

FIG. 29 is a flow chart illustrating a method of refreshing a volatile memory device according to some embodiments.

Referring to FIG. 29, in a method of refreshing a volatile memory device, a plurality of memory cell rows are grouped into a plurality of memory groups according to data retention characteristics of the memory cell rows (S610). The memory cell rows in one memory group may have substantially same data retention characteristics. The memory groups are arranged according to the data retention characteristics and a refresh sequence is generated (S620). The arrangement of the memory groups may be stored in the refresh sequence table 410 in FIG. 5 providing a refresh sequence. Refresh row addresses of the memory cell rows in each of the memory groups are generated according to the refresh sequence (S630).

The refresh sequence set in the refresh sequence buffer 400 may be updated according to operation environment of the volatile memory device 200a. For example, when the temperature of the memory device changes to correspond to a different one of the refresh profile tables 305a, 305b, 305c and 305d, the refresh sequence in the refresh sequence buffer 400a of FIG. 28 may be updated. In this case, attention should be paid such that minimum refresh period must be guaranteed on every memory group during the update.

Figure 30:
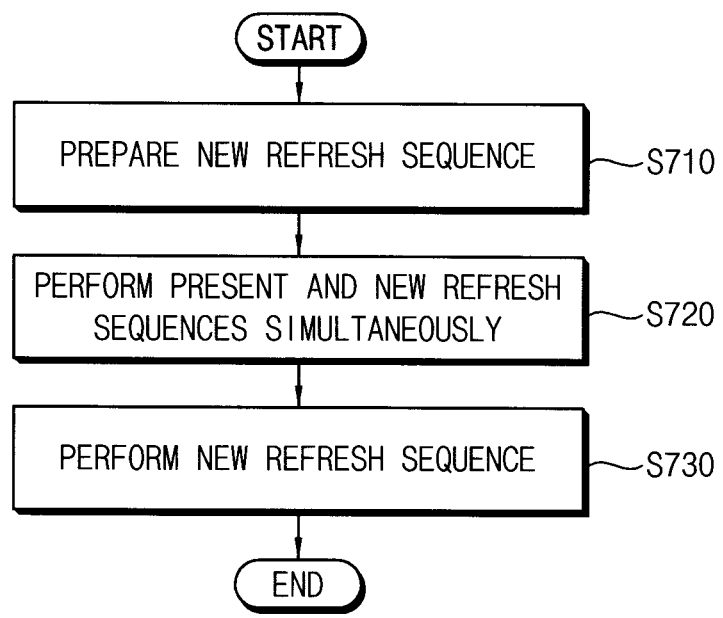
FIG. 30 is a flow chart illustrating a method of updating the refresh sequence according to some embodiments.

FIG. 30 is a flow chart illustrating a method of updating the refresh sequence according to some embodiments.

Referring to FIG. 30, for updating the refresh sequence written in the refresh sequence table 410, a pointer indicating present refresh sequence needs to be updated. Therefore, new refresh sequence is prepared in the refresh sequence table 410 (S710). New refresh sequence is prepared by updating the pointer indicating the present refresh sequence in a plurality of sequence table sets. When one refresh sequence is being completed, refresh operation is performed according to the present and new refresh sequences (S720). After one refresh sequence is completed, refresh operation is performed according to the new refresh sequence (S730).

Figure 31:
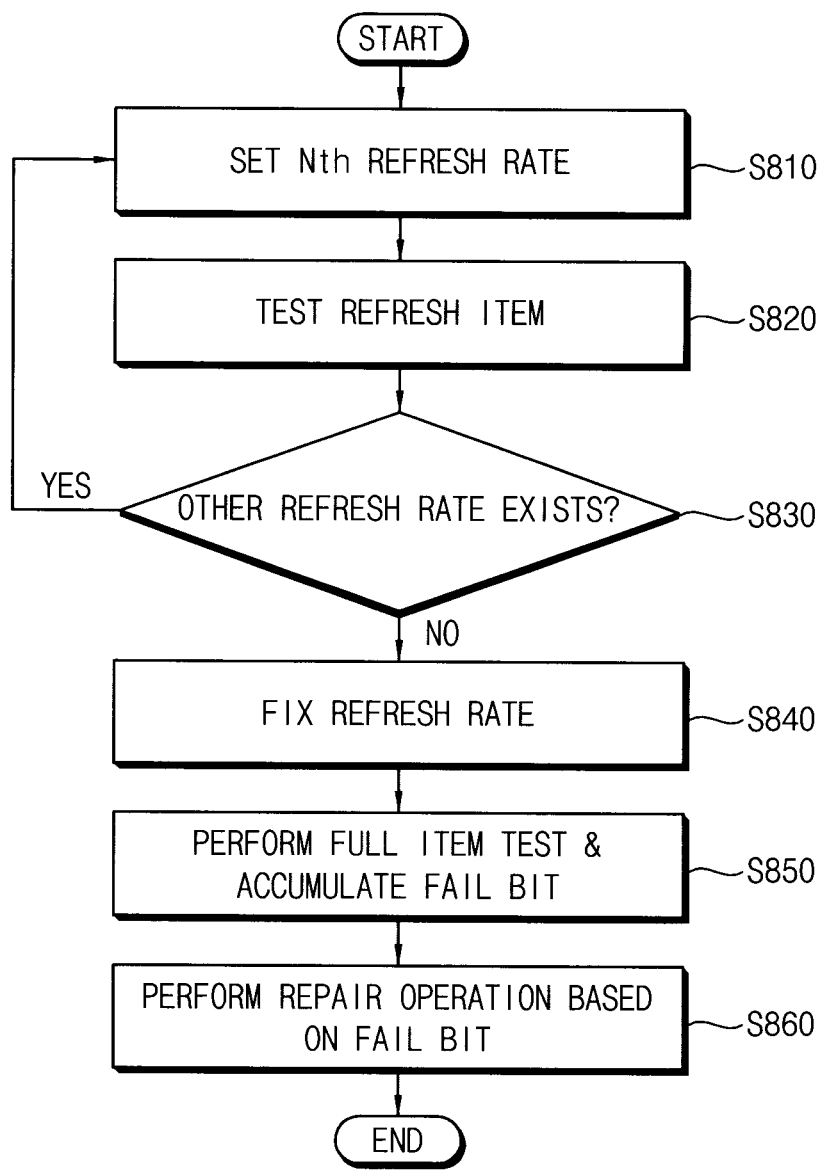
FIG. 31 is a flow chart illustrating a method of testing a volatile memory device according to some embodiments.

FIG. 31 is a flow chart illustrating a method of testing a volatile memory device according to some embodiments.

Referring to FIG. 31, for testing a volatile memory device, nth refresh rate is set for testing data retention characteristics of memory cells, where n is an integer greater than 0 (S810). Data stored in the memory cells is tested according to the nth refresh rate (S820). It is determined whether additional refresh rates should be used to continue testing the data retention characteristics (e.g., has n incremented to a maximum reflecting all refresh rates have been used to test the memory device) (S820). When a further refresh rate exists, n is incremented and the method returns to the step (S810). When a further refresh rate does not exist, a refresh sequence is fixed (S840). When the refresh sequence is fixed, full items of the memory cells is tested and fail bit is accumulated according to test result (S580). Repair operation is performed on the memory cells based on the accumulated fail bit (S760). Through the test, other fail bits in addition to the fail bit being repaired by refresh may be repaired. In the conventional test, test steps are increased because refresh rate are varied and cause of the fail bits is analyzed because repair operation is individually performed according to the fail bits. However, according to example embodiments, increase of test time may be minimized while satisfying the test coverage.

In the refresh scheme according to various embodiments, the refresh sequence programmed into the refresh sequence table 410. Hardware, such as the refresh address sequencer 500, may generate refresh addresses according to the refresh sequence table 410, and thus the hardware such as the refresh address sequencer 460 may be easily implemented. These refresh data structures may be easily shared by a system and a volatile memory device. When a refresh sequence is written in the refresh sequence table 410 after test during manufacturing process of the volatile memory device, a memory controller may grasp refresh characteristic of the memory cell rows by accessing the refresh sequence buffer 400. The contents of the refresh sequence buffer 400 may be updated after the volatile memory device is shipped. Therefore, defects due to variable retention time may be minimized, optimized refresh operation may be performed and current consumption may be minimized after the volatile memory device is shipped.

Figure 32:
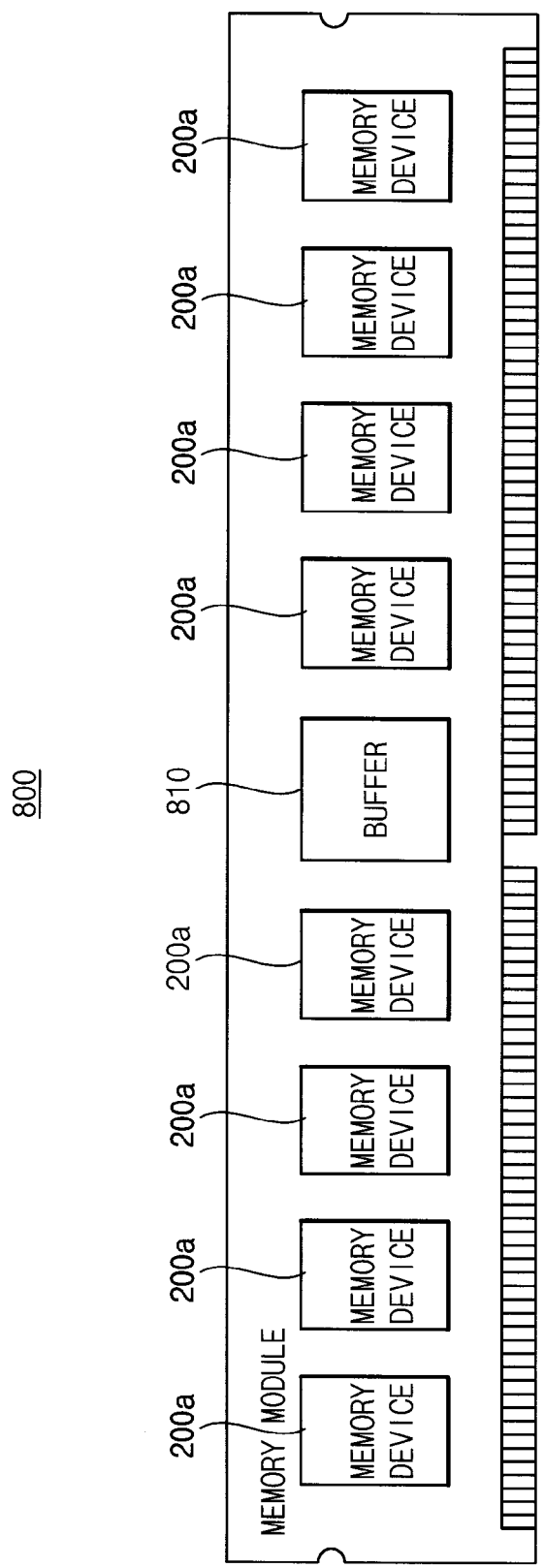
FIG. 32 is a block diagram illustrating a memory module according to some exemplary embodiments.

FIG. 32 is a block diagram illustrating a memory module according to some exemplary embodiments.

Referring to FIG. 32, a memory module 800 may include a plurality of volatile memory devices 200a. In some embodiments, the memory module 800 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 800 may further a buffer 810 that provides a command/address signal and data by buffering the command/address signal and the data from a memory controller through a plurality of transmission lines. In some embodiments, data transmission lines between the buffer 800 and the volatile memory devices 200a may be coupled in a point-to-point topology, and command/address transmission lines between the buffer 810 and the volatile memory devices 200 may be coupled in a multi-drop topology, a daisy-chain topology, a fly-by daisy-chain topology, or the like. Since the buffer 810 buffers both the command/address signal and the data, the memory controller may interface with the memory module 800 by driving only a load of the buffer 810. Accordingly, the memory module 800 may include more volatile memory devices and/or more memory ranks, and a memory system may include more memory modules.

Each of the volatile memory devices 200a may include the refresh address generator 300 in FIG. 3 that includes the refresh sequence buffer 400 and the refresh address sequencer 500 of FIG. 4. Each of the volatile memory devices 200a may perform refresh operations individually according to respective refresh sequences stored in their refresh sequence buffer.

Figure 33:
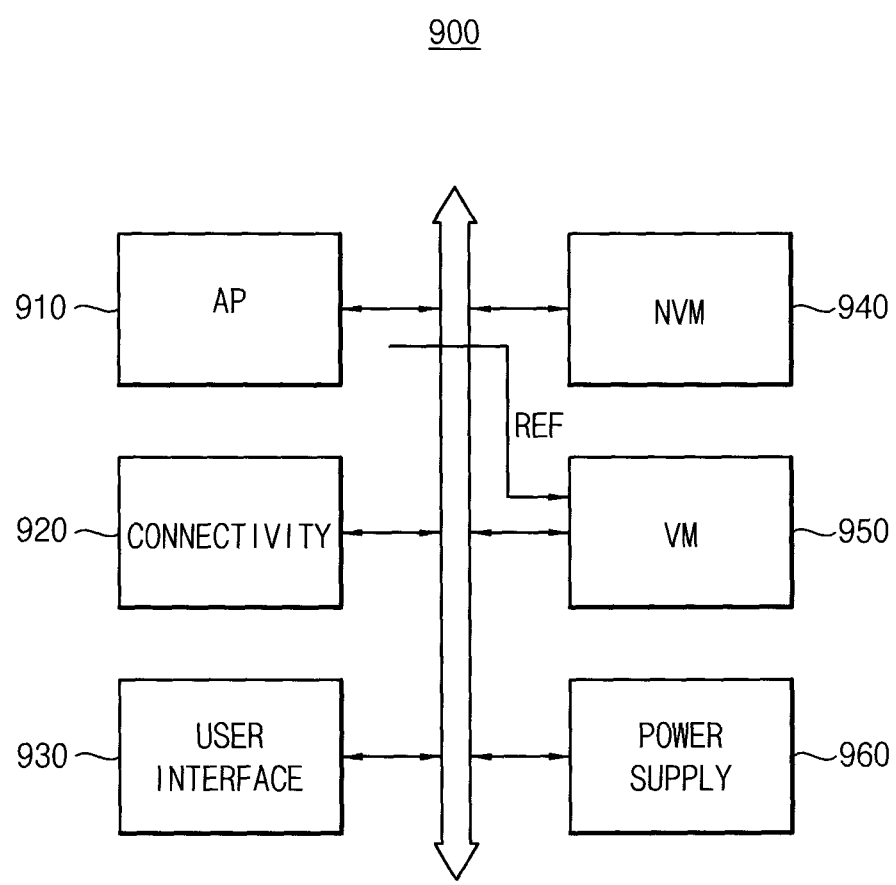
FIG. 33 is a block diagram illustrating a mobile system according to some exemplary embodiments.

FIG. 33 is a block diagram illustrating a mobile system according to some exemplary embodiments.

Referring to FIG. 27, a mobile system 900 includes an application processor 910, a connectivity unit 920, a volatile memory device 950, a nonvolatile memory device 940, a user interface 930 and a power supply 960. In some embodiments, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 950 may store data processed by the application processor 910, or may operate as a working memory. For example, the volatile memory device 950 may be a dynamic random access memory, such as DDR SDRAM, LPDDR SDRAM, GDDR SDRAM, RDRAM, etc., or may be any volatile memory device that requires a refresh operation. The volatile memory device 950 may perform refresh operation in response to refresh signal REF. The volatile memory device 950 includes the refresh address generator 300 in FIG. 3 that includes the refresh sequence buffer 400 and the refresh address sequencer 500 of FIG. 4. The volatile memory device 950 performs refresh operation according to refresh sequence stored in refresh sequence buffer.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 34:
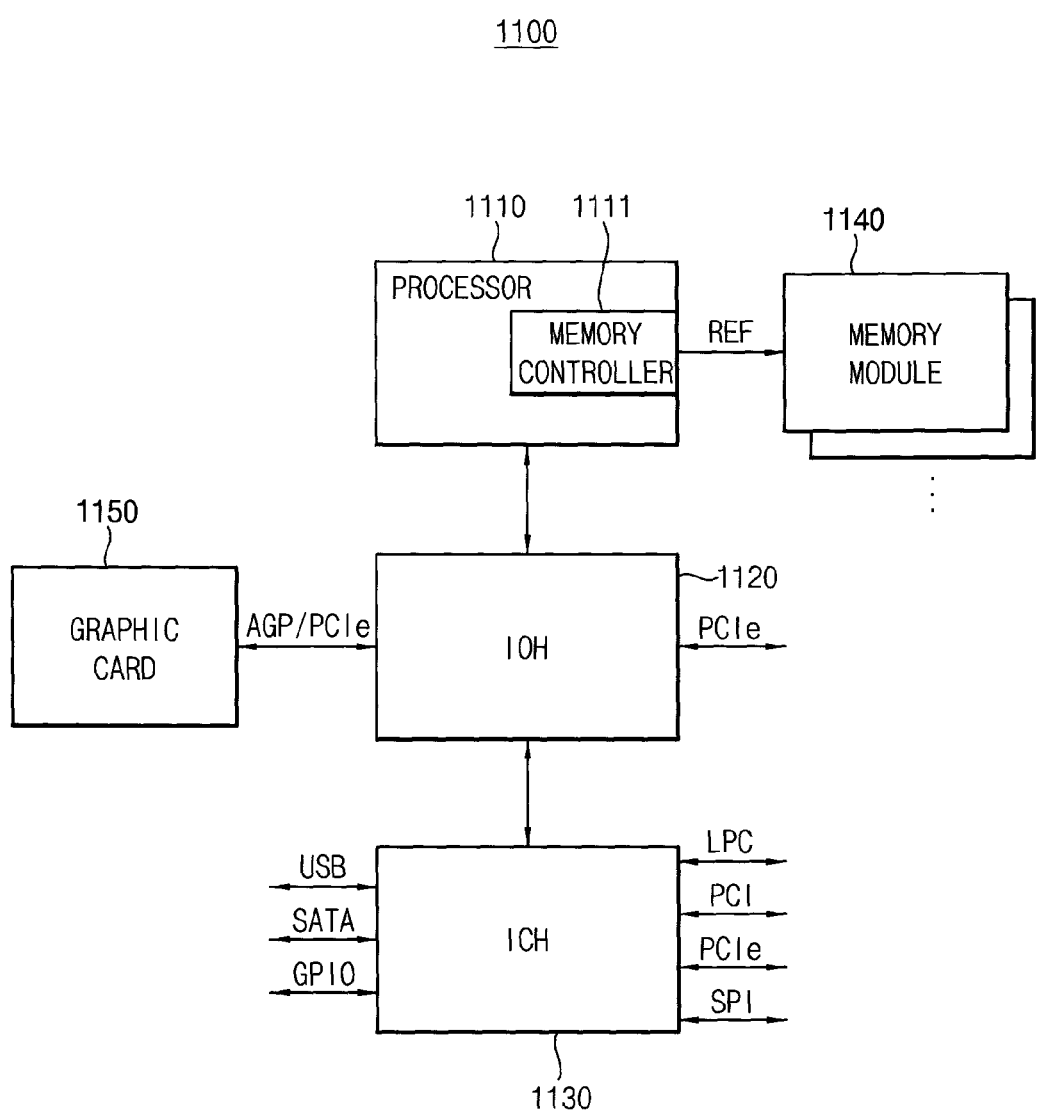
FIG. 34 is a block diagram illustrating a computing system according to some exemplary embodiments.

FIG. 34 is a block diagram illustrating a computing system according to some exemplary embodiments.

Referring to FIG. 34, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 28 illustrates the computing system 1100 including one processor 1110, in some embodiments, the computing system 1100 may include a plurality of processors. The processor 1110 may include an internal or external cache memory.

The memory module 1140 may include a plurality of volatile memory devices that store data provided from the memory controller 1111. The volatile memory devices may perform refresh operation in response to refresh signal REF. The volatile memory devices may include the refresh address generator 300 in FIG. 3 that includes the refresh sequence buffer 400 and the refresh address sequencer 500 of FIG. 4. The volatile memory devices perform refresh operation according to refresh sequence stored in refresh sequence buffer.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a Hyper-Transport, a lightning data transport (LDT), a QuickPath interconnect (QPI), a common system interface (CSI), etc. Although FIG. 40 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal memory device. In some embodiments, the input/output hub 1120 may include an internal graphics device along with or instead of the graphics card 1150 outside the graphics card 1150. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

The present inventive concept may be applied to any volatile memory device that requires a refresh operation and to a system including the volatile memory device. The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A refresh address generator comprising:
a refresh sequence buffer configured to store a sequence of memory groups, each memory group including a plurality of memory cell rows; and
a refresh address generating unit configured to generate a plurality of refresh row addresses according to the sequence of memory groups stored in the refresh sequence buffer, in response to a refresh signal,
wherein the memory groups include a first memory group and a second memory group,
wherein the refresh sequence buffer is configured to maintain a refresh sequence table having a different number of entries for the first memory group and the second memory group, and
wherein the refresh address generating unit is configured to be responsive to the different number of entries for the first memory group and the second memory group to generate refresh row addresses for the first memory group and the second memory group at respectively different rates to accommodate different data retention characteristics of memory cell rows of the first memory group and memory cell rows of the second memory group.

2. The refresh address generator of claim 1, wherein the refresh sequence table comprises a plurality of rows, and each of the rows includes a refresh sequence node that stores refresh addresses included in each of the memory groups and refresh timing.

3. The refresh address generator of claim 2, wherein the refresh addresses of each of the memory groups are designated by a start address and an end address of the respective memory group or are designated by a representative refresh address representing each respective memory group.

4. The refresh address generator of claim 2, wherein the refresh address generating unit comprises:
a control unit that operates in response to the refresh signal, the control unit configured to provide a clock signal and a representative refresh address representing each memory group based on the refresh row addresses and based on refresh timing; and
a refresh address output unit configured to output refresh addresses of each of the memory groups according to the refresh timing as the refresh row address in response to the representative refresh address and the refresh timing.

5. The refresh address generator of claim 2, wherein at least one of the refresh sequence nodes further includes additional refresh address designating at least one memory cell row of at least one of other memory groups.

6. The refresh address generator of claim 5, wherein the memory cell row designated by the additional refresh address has different data retention characteristic from the data retention characteristic of an original memory group.

7. The refresh address generator of claim 5, wherein the additional refresh address is stored in the corresponding refresh sequence node by using a bloom filter.

8. The refresh address generator of claim 5, wherein the refresh address generating unit comprises:
a control unit that operates in response to the refresh signal, the control unit configured to provide a clock signal and a representative refresh address representing each memory group based on the refresh addresses and the refresh timing;
a refresh address output unit configured to output refresh addresses of each of the rearranged memory groups according to the refresh timing as the refresh row address in response to the representative refresh address and the refresh timing; and a buffer configured to store the additional refresh address and to output the additional refresh address as an additional refresh row address according to control of the control unit.

9. The refresh address generator of claim 8, wherein the additional refresh address is output while refresh addresses of a sequence node that stored the additional refresh address are output.

10. The refresh address generator of claim 1, wherein the refresh sequence buffer comprises:

a group table including a plurality of rows; and wherein the refresh sequence table includes a plurality of rows, wherein each row of the plurality of rows of the group table includes, for each memory group, a group index, and refresh addresses included in the memory group, each group index indicating its respective memory group, and wherein each row of the plurality of rows of the refresh sequence table includes, for each memory group, a group index and timing information of each group index.

11. The refresh address generator of claim 10, wherein at least one of the tables further stores additional refresh addresses designating at least one memory cell row of at least one other memory group.

12. The refresh address generator of claim 10, further including a dynamic refresh flag indicating whether a refresh operation should be performed on a respective memory group or not.

13. The refresh address generator of claim 12, wherein the refresh address generating unit is configured to selectively determine whether to perform the refresh operation on each memory group or not based on the dynamic refresh flag.

14. The refresh address generator of claim 12, wherein the refresh address generating unit is configured to perform a refresh address operation corresponding to an additional refresh address without regard to the dynamic refresh flag.

15. The refresh address generator of claim 10, further including a dynamic refresh flag indicating whether a refresh operation should be performed on each memory group or not, wherein the refresh address generating unit is configured to dynamically alter a refresh period of at least one of the memory groups based on the dynamic refresh flag.

16. A volatile memory device comprising:

a volatile memory cell array including a plurality of memory cells, the memory cells being arranged in a plurality of memory cell rows, each memory cell row being addressable with a row address;

a refresh sequence buffer configured to store a sequence of memory cell groups, each memory cell group comprising a set of at least two memory cell rows of the plurality of memory cell rows;

a refresh address generating unit configured to generate a plurality of refresh row addresses according to the sequence of memory cell groups stored in the refresh sequence buffer; and a decoder, configured to decode the refresh row addresses generated by the refresh address generator to affect a refresh operation of memory cell rows corresponding to the refresh row addresses, wherein the memory cell groups include a first memory cell group and a second memory cell group, wherein the refresh sequence buffer is configured to store maintain a table having a different number of entries for the first memory cell group and the second cell memory group, and wherein the refresh address generating unit is configured to be responsive to the different number of entries for the first memory cell group and the second memory cell group to generate refresh row addresses for the first memory cell group and the second memory cell group at respectively different rates.

17. The volatile memory device of claim 16, wherein the refresh sequence buffer is implemented with a static memory device.

18. The volatile memory device of claim 16, wherein the refresh sequence buffer is implemented with a dynamic memory device, and contents to be stored in the refresh sequence buffer are loaded to the refresh sequence buffer from a nonvolatile memory device during a power-up sequence of the volatile memory device.

19. The volatile memory device of claim 16, wherein the refresh sequence buffer is implemented with a nonvolatile memory device.

20. The volatile memory device of claim 16, further comprising:

a temperature sensor configured to sense operating temperature of the volatile memory device and to provide an operation mode signal to the refresh address generator based on the sensed operating temperature; and a refresh profile storing unit that includes a plurality of refresh profile tables, each refresh profile tables storing refresh profile indicating a refresh sequence of the memory cell groups according to the operating temperature, and the refresh profile storing unit provides the refresh sequence buffer with a refresh sequence of a refresh profile table corresponding to the operation mode signal.

21. A memory system comprising:

a memory module including a plurality of volatile memory devices; and a memory controller configured to control the volatile memory devices, wherein each of the volatile memory devices comprises:

a memory cell array including a plurality of memory cell rows;

a refresh address generator configured to generate a plurality of refresh row addresses according to a sequence of memory cell groups, the memory cell groups each including a plurality of memory cell rows being grouped into the memory cell groups based on data retention characteristics of the plurality of memory cell rows;

a refresh sequence buffer configured to maintain a table having the sequence of memory cell groups; and a decoder, configured to decode the refresh row addresses generated by the refresh address generator to affect a refresh operation of memory cell rows corresponding to the refresh row addresses, wherein, for at least one of the volatile memory devices: the memory groups include a first memory cell group and a second memory cell group, the sequence of memory cell groups maintained by the table comprises a different number of entries of the first memory cell group and the second memory cell group, and the refresh address generator is configured to be responsive to the different number of entries for the first memory cell group and the second memory cell group to generate refresh row addresses for the first memory cell group and the second memory cell group at respectively different rates to accommodate different data retention time characteristics of memory cell rows of the first memory group and memory cell rows of the second memory group.

22. The memory system of claim 21, wherein the at least one volatile memory device is responsive to a refresh command REF externally received at a first time to cause generation of the refresh row addresses of the first memory cell group by the refresh address generator and is responsive to the refresh command REF externally received at a second time to cause generation of the refresh row addresses of the second memory cell group by the refresh address generator.

23. The volatile memory device of claim 16, wherein the memory device is responsive to a refresh command REF externally received at a first time to cause generation of the refresh row addresses of the first memory cell group by the refresh address generator and is responsive to the command REF externally received at a second time to cause generation of the refresh row addresses of the second memory cell group by the refresh address generator.

* * * * *